United States Patent
Kim et al.

(10) Patent No.: US 8,598,647 B2
(45) Date of Patent: Dec. 3, 2013

(54) THREE-DIMENSIONAL SEMICONDUCTOR MEMORY DEVICES

(75) Inventors: Dongwoo Kim, Incheon (KR); Toshiro Nakanishi, Seongnam-si (KR); SeungHyun Lim, Yongin-si (KR); Bio Kim, Seoul (KR); Kihyun Hwang, Seongnam-si (KR); Jaeyoung Ahn, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 203 days.

(21) Appl. No.: 13/291,519

(22) Filed: Nov. 8, 2011

(65) Prior Publication Data
US 2012/0112260 A1     May 10, 2012

(30) Foreign Application Priority Data
Nov. 8, 2010    (KR) .................. 10-2010-0110533

(51) Int. Cl.
*H01L 29/788*    (2006.01)
(52) U.S. Cl.
USPC ........................... 257/315; 257/316; 257/317
(58) Field of Classification Search
USPC ................................................. 257/315, 319
See application file for complete search history.

(56) References Cited

U.S. PATENT DOCUMENTS

2009/0310425 A1*  12/2009  Sim et al. ................. 365/185.29
2010/0120214 A1*   5/2010  Park et al. ..................... 438/287

FOREIGN PATENT DOCUMENTS

| JP | 2009-295617 | 12/2009 |
|---|---|---|
| KR | 1020090123481 A | 12/2009 |
| KR | 1020100050790 A | 5/2010 |

* cited by examiner

*Primary Examiner* — Thao Le
*Assistant Examiner* — Geoffrey Ida
(74) *Attorney, Agent, or Firm* — Myers Bigel Sibley & Sajovec

(57) ABSTRACT

Provided are three-dimensional semiconductor devices. The device includes conductive patterns stacked on a substrate, and an active pattern penetrating the conductive patterns to be connected to the substrate. The active pattern includes a first doped region disposed adjacent to at least one of the conductive patterns, and a diffusion-resistant doped region overlapped with at least a portion of the first doped region. The diffusion-resistant doped region may be a region doped with carbon.

14 Claims, 29 Drawing Sheets

THREE-DIMENSIONAL SEMICONDUCTOR MEMORY DEVICES

CROSS-REFERENCE TO RELATED APPLICATIONS

This U.S. non-provisional patent application claims priority under 35 U.S.C. §119 to Korean Patent Application No. 10-2010-0110533, filed on Nov. 8, 2010, in the Korean Intellectual Property Office, the entire contents of which are hereby incorporated by reference.

BACKGROUND

Example embodiments of the inventive concept relate to semiconductor devices, and more particularly, to three-dimensional semiconductor memory devices including three-dimensionally arranged memory cells.

A three-dimensional integrated circuit (3D-IC) memory technique may be used to increase a memory capacity. The 3D-IC memory technique may generally refer to technology related to arranging memory cells three-dimensionally.

One 3D-IC technique is a punch-and-plug technique. The punch-and-plug technique includes sequentially forming multi-layered thin layers on a substrate and then forming plugs to penetrate the thin layers. Through this technique, without a drastic increase of manufacturing costs, a three-dimensional memory device may obtain an increased memory capacity.

SUMMARY

Example embodiments of the inventive concept may provide three-dimensional memory devices with improved electrical properties.

According to some embodiments of the inventive concept, a three-dimensional semiconductor device may include a substrate, conductive patterns stacked on the substrate, and an active pattern penetrating the conductive patterns to be connected to the substrate. The active pattern may include a first doped region disposed adjacent to some of the conductive patterns, and a diffusion-resistant doped region overlapped with at least a portion of the first doped region. The diffusion-resistant doped region may be doped with carbon.

In some embodiments, the conductive patterns may include word lines and at least one string selection line disposed on the word lines and the diffusion-resistant doped region may be provided in a portion of the active pattern adjacent to the string selection line.

In some embodiments, the active pattern may include channel regions disposed adjacent to the conductive patterns and channel connecting regions interposed between the channel regions. A point with the highest impurity concentration of the first doped region and a point with the highest carbon concentration of the diffusion-resistant doped region may be located in the channel connecting region interposed between the string selection lines.

In some embodiments, the active pattern may be formed of a silicon containing material, and in the diffusion-resistant doped region, the number of carbon atoms per unit volume may be about 0.1% to about 2% with respect to the number of silicon atoms per unit volume.

In some embodiments, the first doped region may be provided within the diffusion-resistant doped region.

In some embodiments, a point with the highest carbon concentration of the diffusion-resistant doped region may be located at a higher level than a point with the highest impurity concentration of the first doped region.

In some embodiments, the device may further include a second doped region provided in an upper portion of the active pattern. The diffusion-resistant doped region and the first doped region may be formed spaced apart from the second doped region.

In some embodiments, the device may further include a memory layer interposed between the conductive patterns and the active pattern.

According to other example embodiments of the inventive concept, a three-dimensional semiconductor device may include a substrate, a first inversion inducing pattern disposed on the substrate, conductive patterns interposed between the substrate and the first inversion inducing pattern, and active patterns penetrating the first inversion inducing pattern and the conductive patterns to be connected to the substrate. The first inversion inducing pattern may be in an electrically floating state.

In some embodiments, the device may further include a second doped region disposed on an upper portion of the active patterns. The first inversion inducing pattern may have a top surface lower than that of the second doped region.

In some embodiments, the device may further include a second doped region disposed on an upper portion of the active patterns. The first inversion inducing pattern may have a top surface higher than a bottom surface of the second doped region.

In some embodiments, the device may further include an insulating layer interposed between the first inversion inducing pattern and the active patterns.

In some embodiments, the first inversion inducing pattern may extend along a running direction of the conductive patterns to cross the active patterns.

In some embodiments, the first inversion inducing pattern may be separated into a plurality of patterns, each of which surrounds the corresponding one of the active patterns.

In some embodiments, the active patterns may include a first active pattern on the substrate, a second active pattern on the first active pattern, and a connection pad connecting the first active pattern with the second active pattern. The device may further include a second inversion inducing pattern interposed between two of the conductive patterns adjacently disposed on and below the connection pad, and the second inversion inducing pattern may be in an electrically floating state.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments will be more clearly understood from the following brief description taken in conjunction with the accompanying drawings.

FIG. 1 is a circuit diagram of a three-dimensional semiconductor memory device according to some embodiments of the inventive concept.

FIGS. 2 and 3 are a perspective view and an enlarged sectional view, respectively, of a three-dimensional semiconductor device according to some embodiments of the inventive concept.

FIGS. 4 through 7 are graphs illustrating doping profiles of a first doped region and a diffusion-resistant doped region according to some embodiments of the inventive concept.

FIGS. 8 through 14 are sectional views illustrating methods of fabricating a three-dimensional semiconductor device according to some embodiments of the inventive concept.

FIGS. 15 through 20 are perspective or sectional views illustrating methods of fabricating a three-dimensional semiconductor device according to some embodiments of the inventive concept.

FIGS. 21 through 24 are perspective or sectional views of a three-dimensional semiconductor device and methods of fabricating the same according to some embodiments of the inventive concept.

FIG. 25 is a sectional view exemplarily illustrating methods of fabricating a three-dimensional semiconductor device according to some embodiments of the inventive concept.

FIGS. 26 through 28 are perspective views exemplarily illustrating memory layers according to some embodiments of the inventive concept.

FIG. 29 is a schematic block diagram illustrating an example of a memory system including a three-dimensional semiconductor memory device according to some embodiments of the inventive concept.

FIG. 30 is a block diagram illustrating an example of a memory card including a three-dimensional semiconductor memory device according to some embodiments of the inventive concept.

FIG. 31 is a block diagram illustrating an example of an data processing system including a three-dimensional semiconductor memory device according to some embodiments of the inventive concept.

Figure 1:
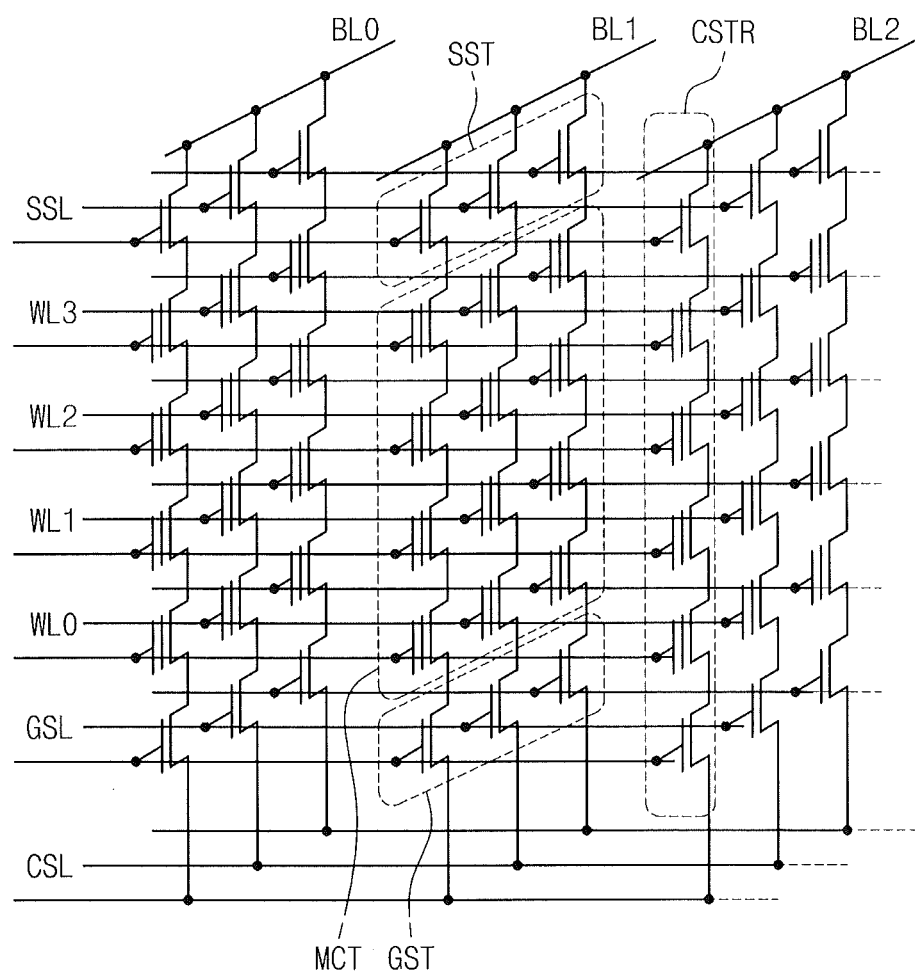
FIGS. 1 through 31 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A three-dimensional (3D) semiconductor memory device according to some embodiments of the inventive concept may include a cell array region, a peripheral circuit region, a sense amp region, a decoding circuit region, and a connection region. A plurality of memory cells and bit lines and word lines for electrical connection to the plurality of memory cells may be in the cell array region. Circuits for driving the memory cells may be in the peripheral circuit region, and circuits for reading information stored in the memory cells may be in the sense amp region. The connection region may be between the cell array region and the decoding circuit region, and a wiring structure for electrically connecting the word lines with the decoding circuit region may be between the word lines and the decoding region.

FIG. 1 is a circuit diagram of a 3D semiconductor memory device according to some embodiments of the inventive concept.

Referring to FIG. 1, in some embodiments of the inventive concept, the cell array of the 3D semiconductor memory device may include common source lines CSL, bit lines BL0, BL1, and BL2 and cell strings CSTR interposed between the common source lines CSL and the bit lines BL0-BL2.

The bit lines BL0-BL2 may be two-dimensionally arranged and plural ones of the cell strings CSTR may be connected in parallel to each of the bit lines BL. Plural ones of the cell strings CSTR may be connected in common to a corresponding one of the common source lines CSL. That is, plural ones of the cell strings CSTR may be disposed between the bit lines BL0-BL2 and each of the common source lines CSL. In some embodiments, the common source lines CSL may be connected with one another in an equipotential state. Otherwise, in other embodiments, the common source lines CSL may be electrically separated from one another such that they are controlled independently.

Each of the cell strings CSTR may include a ground selection transistor GST coupled to the common source lines CSL, a string selection transistor SST coupled to the bit lines BL0-BL2, and a plurality of memory cell transistors MCT disposed between the ground selection transistor GST and the string selection transistors SST. Here, the plurality of memory cell transistors MCT may be connected in series between the ground selection transistor GST and the string selection transistor SST.

Sources regions of plural ones of the ground selection transistors GST may be connected in common to one of the common source lines CSL. In addition, ground selection lines GSL, word lines WL0 to WL3, and string selection lines SSL, which serve as gate electrodes of the ground selection transistor GST, the memory cell transistors MCT and the string selection transistor SST, respectively, may be disposed between the common source lines CSL and the bit lines BL0-BL2. Moreover, each of the memory cell transistors MCT may include a data storage element.

In some aspects of the inventive concept, one of the cell strings CSTR may include a plurality of the memory cell transistors MCT disposed (or spaced) respectively different distances apart from the corresponding common source lines CSL. That is, between the common source lines CSL and the bit lines BL0-BL2, there may be a multi-layered word line structure including the word lines WL0-WL3 disposed at different levels from each other.

In addition, gate electrodes of the memory cell transistors MCT, which are disposed at the substantially same level from the common source lines CSL, may be connected in common to one of the word lines WL0-WL3 such that they are in an equipotential state. Some embodiments provide that, although gate electrodes of the memory cell transistors MCT may be disposed at the substantially same level from the common source lines CSL, a portion thereof (e.g., gate electrodes disposed in one row or column) may be electrically and/or spatially separated from another portion thereof (e.g., gate electrodes disposed in other row or column).

Figure 2:
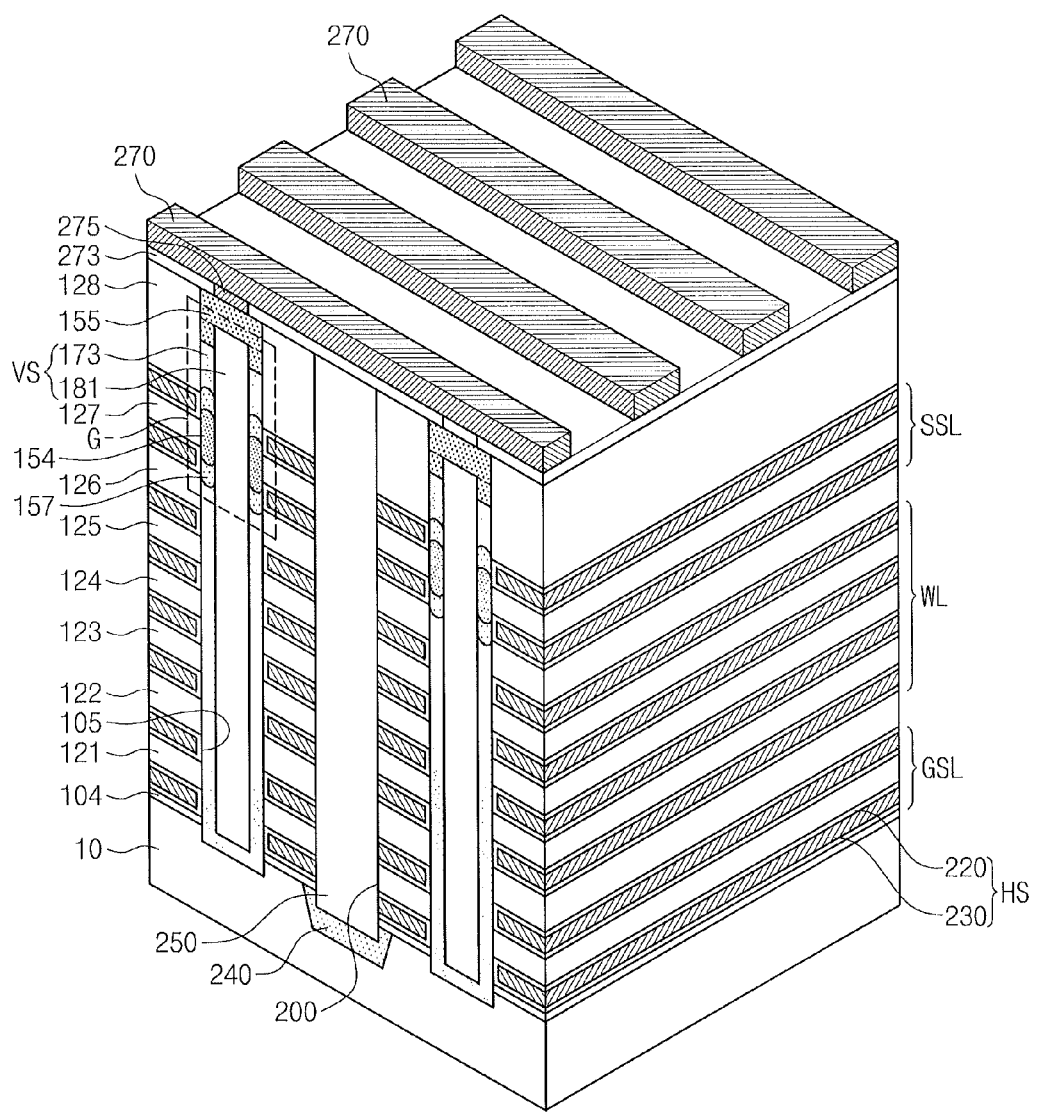
Figure 3:
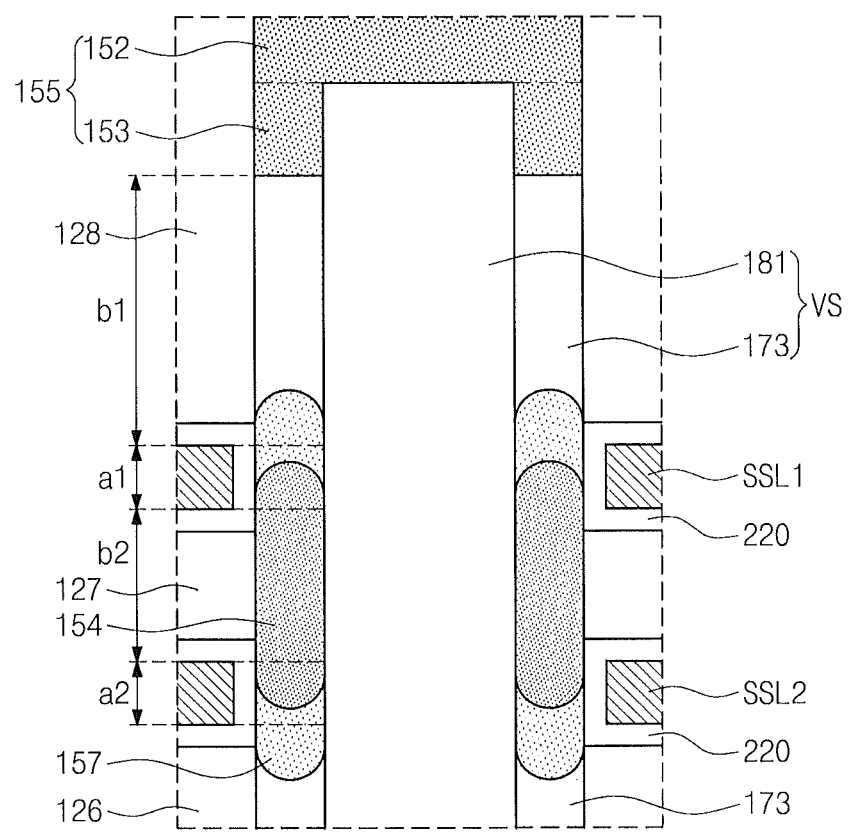

FIG. 2 is a perspective view of a three-dimensional semiconductor device according to some embodiments of the inventive concept, and FIG. 3 is an enlarged sectional view of a portion G of FIG. 2.

Referring to FIGS. 2 and 3, conductive patterns 230 and first to eighth insulating layers 121-128 may be stacked on a substrate 10 in an alternating manner. The substrate 10 may be formed of a semiconductor material, an insulating material, or a semiconductor or conductive material covered with an insulating layer. For example, the substrate 10 may be a silicon wafer. The substrate 10 may be provided as a structure doped with impurities of a first conductivity type. For instance, the substrate 10 may be a p-type silicon wafer.

The conductive patterns 230 may include at least one layer of doped silicon, metal, metal nitride, or metal silicide. For example, the conductive patterns 230 may include a layer of tantalum nitride or tungsten. The insulating layers 121-128 may include at least one of silicon oxide or silicon nitride. In some embodiments, as shown in FIG. 2, lowermost two layers of the conductive patterns 230 may serve as ground selection lines GSL, and uppermost two layers thereof may serve as the string selection lines SSL1 and SSL2. The others of the conductive patterns 230 may serve as word lines WL.

In some embodiments, at least one of the insulating layers 121-128 may be formed to have a different thickness from the others. For instance, the insulating layer second from the bottom (hereinafter, second insulating layer 122) and the insulating layer third from the top (hereinafter, sixth insulating layer 126) may be thicker than other insulating layers 121, 123-125 and 127. Moreover, the uppermost insulating layer 128 may be thicker than the second and sixth insulating layers 122 and 126.

First structures VS may be provided to penetrate the conductive patterns 230. For instance, the first structures VS may be provided in channel holes 105 penetrating the conductive patterns 230. Here, each of the channel holes 105 may have a circular, elliptical, or linear section in plan view.

The first structures VS may include active patterns 173 provided on an inner surface of the channel holes 105 and a first gap-filling pattern 181 filling the channel holes 105 provided with the active patterns 173. In some embodiments, the first gap-filling pattern 181 may be formed of at least one of silicon nitride or silicon oxide, and the active patterns 173 may be formed of polysilicon. In other embodiments, the active patterns 173 may be formed of at least one of organic semiconductors or carbon-nano materials. In some embodiments, the active patterns 173 may be formed to have a substantially conformal thickness, such that the channel holes 105 are not completely filled by the active patterns 173.

Each of the active patterns 173 may include channel regions adjacent the conductive patterns 230 and channel connecting regions between the channel regions. In some embodiments, as shown in FIG. 3, the channel regions may include a first channel regional adjacent the first string selection line SSL1 and a second channel region a2 adjacent the second string selection line SSL2, and the channel connecting regions may include a first channel connecting region b1 provided on the first channel regional, and a second channel connecting region b2 provided between the first and second channel regions a1 and a2.

In the case that a voltage is applied to the conductive patterns 230 during an operation of the 3D semiconductor memory device, an energy band structure of the active patterns 173 adjacent the conductive patterns 230 (i.e., the channel region) may be changed by an electric field from the conductive patterns 230. For instance, if the voltage applied to the conductive patterns 230 is high, an inversion region may be formed in the channel region. In the meantime, the energy band structure of the channel connecting regions may be also changed by an electric fringe field from the conductive patterns 230. As a result, for instance, the inversion region may extend to other portions of the active patterns 173 adjacent the insulating layers 121~128 (i.e., the channel connecting regions). The extending portion of the inversion region may serve as a common or source/drain electrode, which is shared in common by two transistors vertically spaced apart from each other. In some embodiments, the sharing of the extending portion of the inversion region may be used to electrically connect transistors, which use the ground selection lines GSL, the word lines WL, and the string selection lines SSL as their gate electrodes.

A memory layer 220 may be provided between the conductive patterns 230 and the first structures VS. The memory layer 220 and the conductive patterns 230 may constitute second structures HS. The structure of the memory layers 221-228 will be described in more detail with reference to FIGS. 26 through 28.

Second doped regions 155 may be provided in an upper portion of the first structures VS.

In some embodiments, the second doped regions 155 may be configured to electrically connect the cell strings to the bit lines BL. The second doped regions 155 may be doped with impurities having a conductivity type different from the substrate 10. For instance, the second doped region 155 may be n-type. In some embodiments, the second doped region 155 may include a second impurity injection region 152 provided on the first gap-filling pattern 181 and an impurity extension region 153 extending downward from the second impurity injection region 152 toward the substrate 10. As will be described below, the impurity extension region 153 may be formed as a result of downward diffusion of impurities injected in the second impurity injection region 152, which may occur during a subsequent thermal treatment process.

A first doped region 154 may be provided in the active patterns 173 adjacent the string selection lines SSL1 and SSL2. The first doped region 154 may have the same conductivity type as the substrate 10. For instance, the first doped region 154 and the substrate 10 may be p-type. In some embodiments, boron (B) may be used as the p-type impurity for forming the first doped region 154. The first doped region 154 may be an impurity region provided for adjusting threshold voltages, Vth, of the string selection transistors SST controlled by the string selection lines SSL1 and SSL2.

A diffusion-resistant doped region 157 may be provided in the active patterns 173 adjacent to the string selection lines SSL1 and SSL2. The diffusion-resistant doped region 157 may be doped with diffusion-resistant elements capable of suppressing a diffusion of p-type impurities from occurring within a silicon lattice. In some embodiments, the diffusion-resistant element may be carbon (C). In more detail, in the case that boron is used as the p-type impurity, boron atoms may be diffused through interstitial sites in the active patterns 173. However, carbon atoms injected into the active patterns 173 may prevent the boron atoms from being diffused via the interstitial sites. In some embodiments, in the diffusion-resistant doped region 157, the number of carbon atoms per unit volume may be about 0.1% to about 2% with respect to the number of silicon atoms per unit volume.

In some embodiments, there may be a difference in doping profile of the first doped region 154 between the cell strings. For instance, in the case that the diffusion-resistant doped region 157 is formed using an ion implantation process, a mean or maximum depth of injected impurities may vary depending on a position of the cell string on a semiconductor wafer. This depth difference may lead to non-uniformity in electric characteristics of the selection transistor. Furthermore, this depth difference may be deepened after a subsequent thermal treatment or annealing step. However, according to some embodiments of the inventive concept, it is possible to suppress this change in doping profile caused by the impurity diffusion from occurring.

In the case that impurities in the first doped region 154 are diffused into the first channel connecting region b1, it may become more difficult for the fringe field applied to the first string selection line SSL1 to induce an inversion region in the first channel connecting region b1. This may result in an increase in electric resistance of the first channel connecting region b1. However, according to some embodiments of the inventive concept, the presence of the diffusion-resistant doped region 157 can prevent the p-type impurities from being diffused, and therefore, the increase in electric resistance of the first channel connecting region b1 can be suppressed.

In some embodiments, a second gap-filling pattern 250 may be provided to penetrate the conductive patterns 230. The second gap-filling pattern 250 may be provided in a trench 200 penetrating the conductive patterns 230 and exposing the substrate 10. A third doped region 240 may be provided below the second gap-filling pattern 250. The third doped region 240 may have a different conductivity type from the substrate 10. For instance, the third doped region 240 may be n-type.

Upper plugs 275 may be provided on the first structures VS, respectively, and upper interconnection lines 270 may be provided on the upper plugs 275 to connect the upper plugs 275 with each other. The upper plugs 275 may be provided in an interlayer dielectric 273. The upper plugs 275 and the upper interconnection lines 270 may be formed of at least one of doped silicon and metallic materials. Each of the upper interconnection lines 270 may be electrically connected to the corresponding one of the first structures VS, via the corresponding one of the upper plugs 275. The upper interconnection lines 270 may be formed to cross the second structures HS or the trench 200. According to some embodiments of the inventive concept with respect to a NAND FLASH memory, the upper interconnection lines 270 may serve as the bit lines connected to upper ends of cell strings.

FIGS. 4 through 7 are graphs exemplarily illustrating doping profiles of the first doped region 154 and the diffusion-resistant doped region 157. The x-axis represents positions of the channel regions a1 and a2 and the channel connecting regions b1 and b2 in FIG. 3, and the y-axis represents a relative doping concentration. In the graphs, the solid lines represent a doping concentration of the p-type impurities, and the dotted lines represent a doping concentration of carbon (C).

Figure 4:
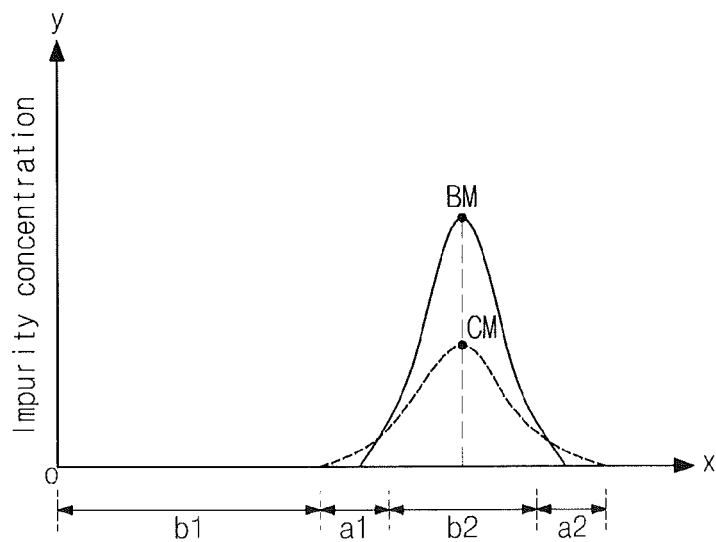

Referring to FIG. 4, the first doped region 154 may be provided in the diffusion-resistant doped region 157. For instance, the diffusion-resistant doped region 157 may be overlapped with the entire region of the first doped region 154. In some embodiments, a B-point BM, whose p-type impurity concentration is highest in the first doped region 154, may be formed at the substantially same depth as a C-point CM, whose carbon concentration is highest. In some embodiments, the B- and C-points may be positioned between the string selection lines SSL1 and SSL2 or in the second channel connecting region b2.

Figure 5:
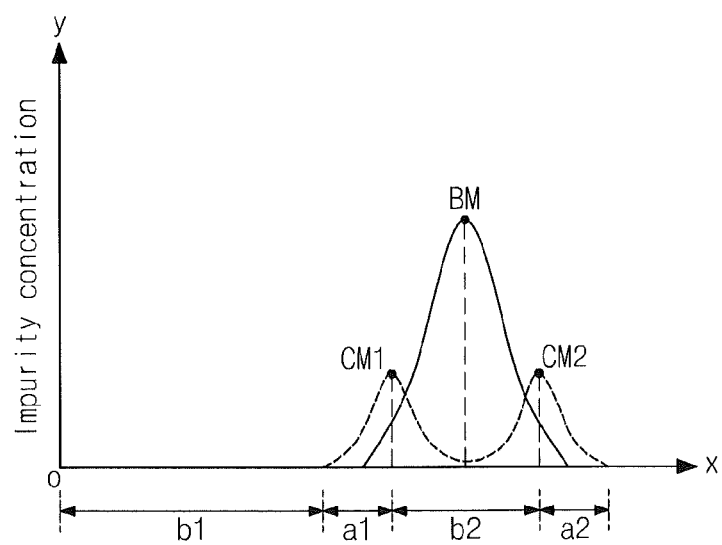

The diffusion-resistant doped region 157 may be formed in such a way that two peak points CM1 and CM2 are in the carbon doping profile curve, as shown in FIG. 5. In some embodiments, the B-point BM may be formed between the carbon peak points CM1 and CM2.

Figure 6:
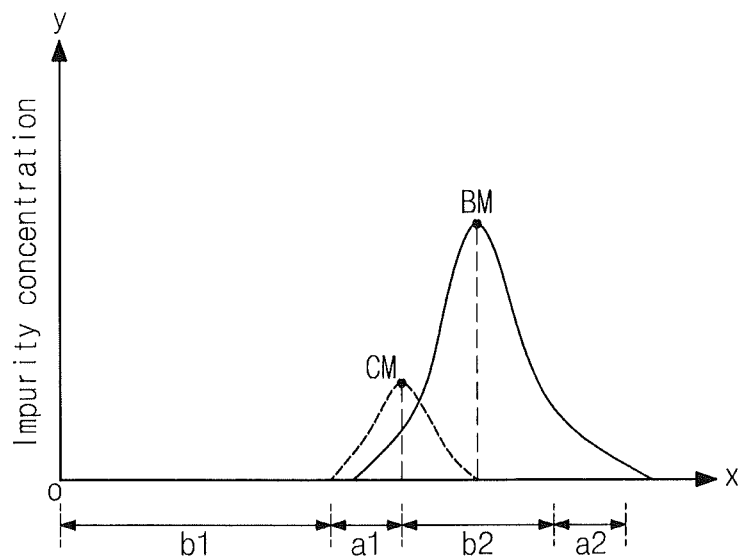
Figure 7:
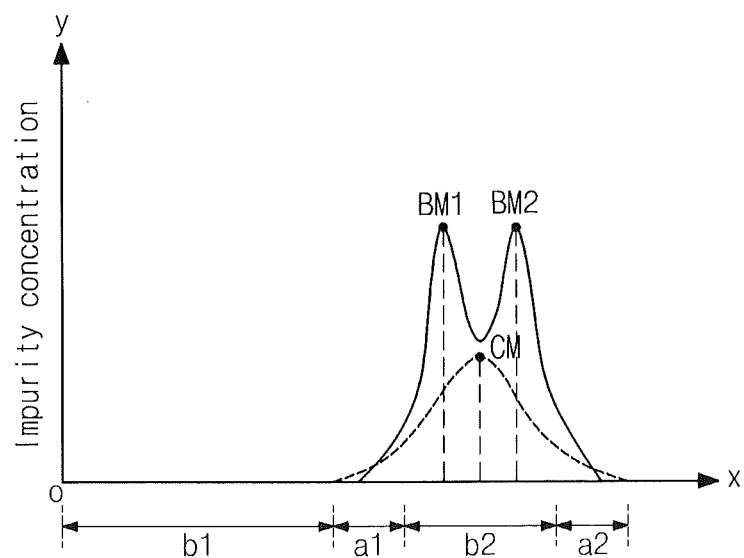

As shown in FIG. 6, a depth of the C-point CM may be shallower than that of the B-point BM. In this case, some of the p-type impurities may be downward diffused, for instance, into the second channel region a2 or to a region disposed below the second channel region a2. As shown in FIG. 7, the p-type impurities may be doped in such a way that two p-type impurity peak points BM1 and BM2 are in the p-type impurity doping profile curve, and the C-point CM may be formed between the p-type impurity peak points BM1 and BM2. Until now, doping profiles according to some embodiments of the inventive concept have been exemplarily described with reference to FIGS. 4 through 7, but embodiments of the inventive concept are not limited thereto. For instance, in some embodiments of the inventive concept, the carbon doping profile can be modified in order to prevent p-type impurities from being diffused (especially, upward to the first channel connecting region b1).

Methods of fabricating a three-dimensional semiconductor device according to some embodiments of the inventive concept will be described with reference to FIGS. 8 through 14. For convenience in description, the aforesaid technical features may be omitted below.

Figure 8:
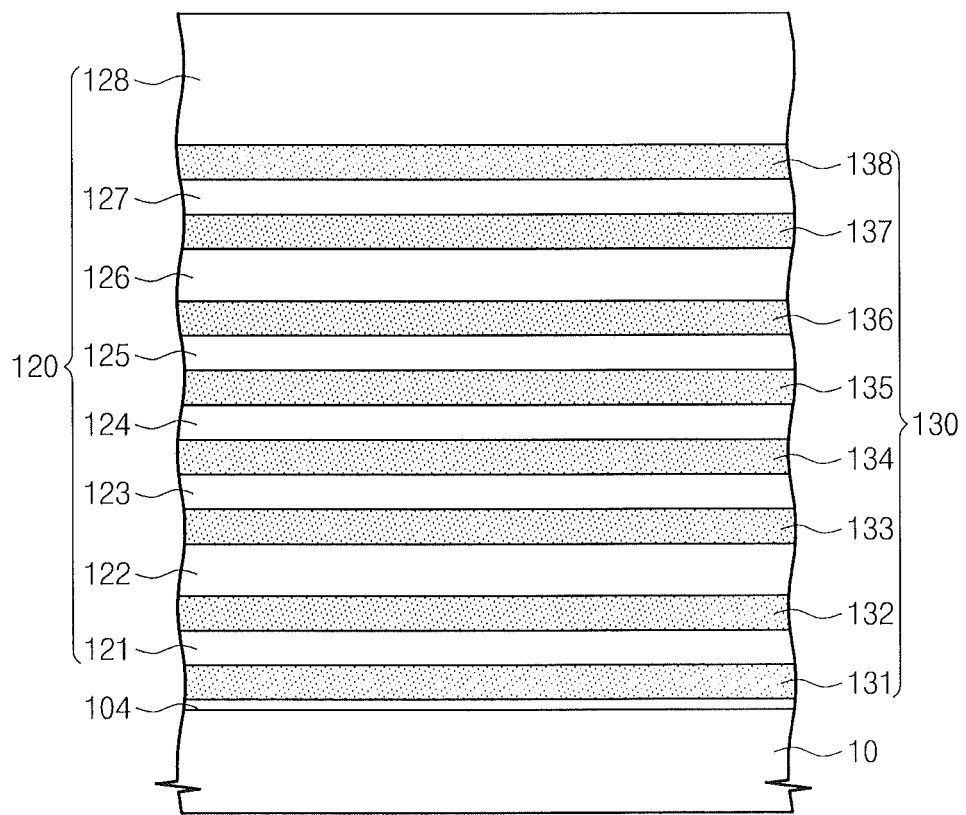

Referring to FIG. 8, a mold structure may be formed on a substrate 10. The substrate 10 may be formed of a semiconductor material, an insulating material, or a semiconductor or conductive material covered with an insulating layer. For example, the substrate 10 may be a silicon wafer. The substrate 10 may be provided as a structure doped with impurities of a first conductivity type. For instance, the substrate 10 may be a p-type silicon wafer. The mold structure may include a plurality of sacrificial layers 130 and a plurality of insulating layers 120 alternatingly stacked on the substrate 10. In order to reduce complexity in the drawings and to provide better understanding of example embodiments of the inventive concept, it will be assumed that the sacrificial layers 130 include first to eighth sacrificial layers 131-138 and the insulating layers 120 include first to eighth insulating layers 121-128.

The sacrificial layers 130 and the insulating layers 120 may be formed of materials having an etch selectivity with respect to each other. For instance, the insulating layers 120 may be formed of a material that is etched at a slower rate than a material of the sacrificial layer 130 with respect to an etchant for removing the sacrificial layers 130. The etch selectivity may be quantitatively expressed as a ratio of an etch rate of the sacrificial layer 130 to the insulating layer 120. In some embodiments, the sacrificial layer 130 may be one or more materials providing an etch selectivity of 1:10 to 1:200 (e.g., 1:30 to 1:100) with respect to one or more materials of the insulating layers 120. For example, the insulating layers 120 may be at least one of a silicon oxide and a silicon nitride, and the sacrificial layers 130 may be at least one of silicon, a silicon oxide, a silicon carbide and silicon nitride. The sacrificial layers 130 may be selected to be a different material from the insulating layers 120. In the following description, for easier understanding of example embodiments of the inventive concept, example embodiments will be described with respect to the insulating layers 120 of silicon oxide and the sacrificial layers 130 of silicon nitride. However, embodiments are not limited to silicon oxide and silicon nitride, and each layer is not limited to a single material. In addition, a buffer layer 104 may be further provided between the first sacrificial layer 131 and the substrate 10, and in some embodiments, the buffer layer 104 may be formed of silicon oxide.

At least one of the insulating layers 120 may be formed to have a different thickness from the others. For instance, the second insulating layer 122 and the sixth insulating layer 126 may be thicker than other insulating layers 121, 123-125 and 127. Moreover, the uppermost insulating layer 128 may be thicker than the second and sixth insulating layers 122 and 126, in consideration of a thickness reduction, which may result from a subsequent planarizing or etching process, or an expansion of a second doped region to be described below. The thicknesses of the insulating layers 120 and the sacrificial layers 130 may be modified from the drawings and the number of layers constituting the mold structure 100 may be diversely modified.

Figure 9:
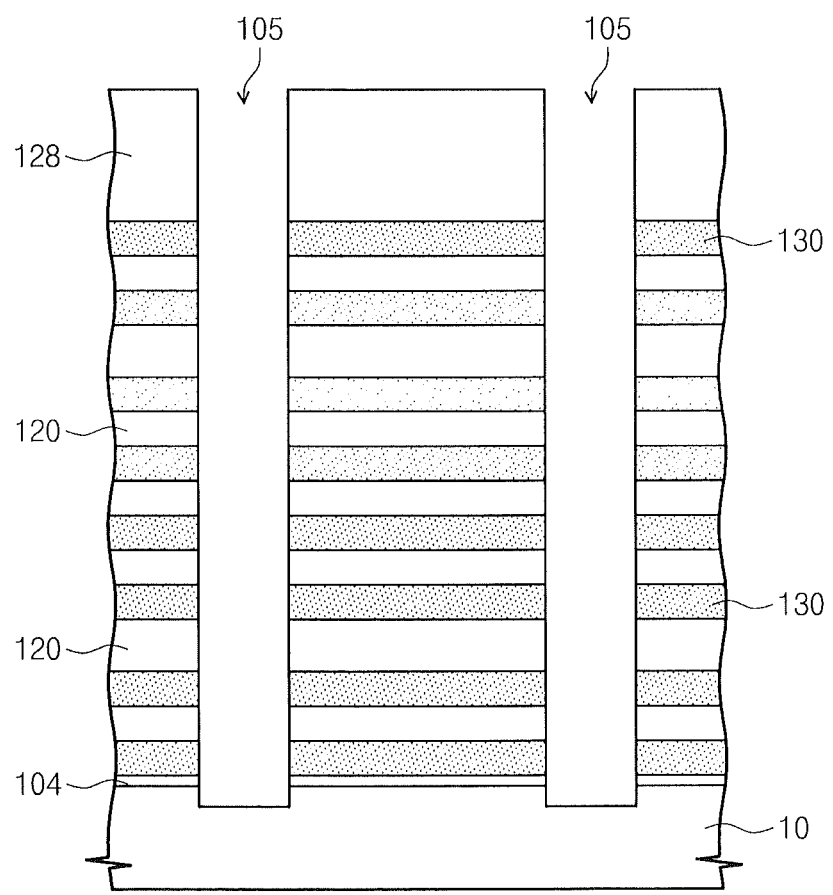

Referring to FIG. 9, channel holes 105 may be formed to penetrate the sacrificial layers 130 and the insulating layers 120. Here, each of the channel holes 105 may have a circular, elliptical, and/or linear section in plan view. Each of the channel holes 105 may be formed with a shape in which its depth may be at least five times its width (e.g., an aspect ratio of 5:1). In some embodiments, the channel holes 105 may be two-dimensionally formed on the top surface (i.e., the xy plane) of the substrate 10. For example, each of channel holes 105 may be an isolated region spaced apart from other channel holes 105 along x and y directions.

The formation of the channel holes 105 may include forming a mask pattern defining positions of the channel holes 105 on the mold structure and, for example, anisotropically etching the mold structure using the mask pattern as an etch mask. Because the mold structure may include two kinds of different layers, the sidewall of the channel holes 105 may not be completely perpendicular to the top surface of the substrate 10. For example, the channel holes 105 may be formed to have a downward tapered shape.

As shown in FIG. 9, the channel holes 105 may be formed to expose the top surface of the substrate 10. In some embodiments, the substrate 10 below the channel holes 105 may be recessed due to over-etch during the anisotropic etching of the mold structure 100.

Figure 10:
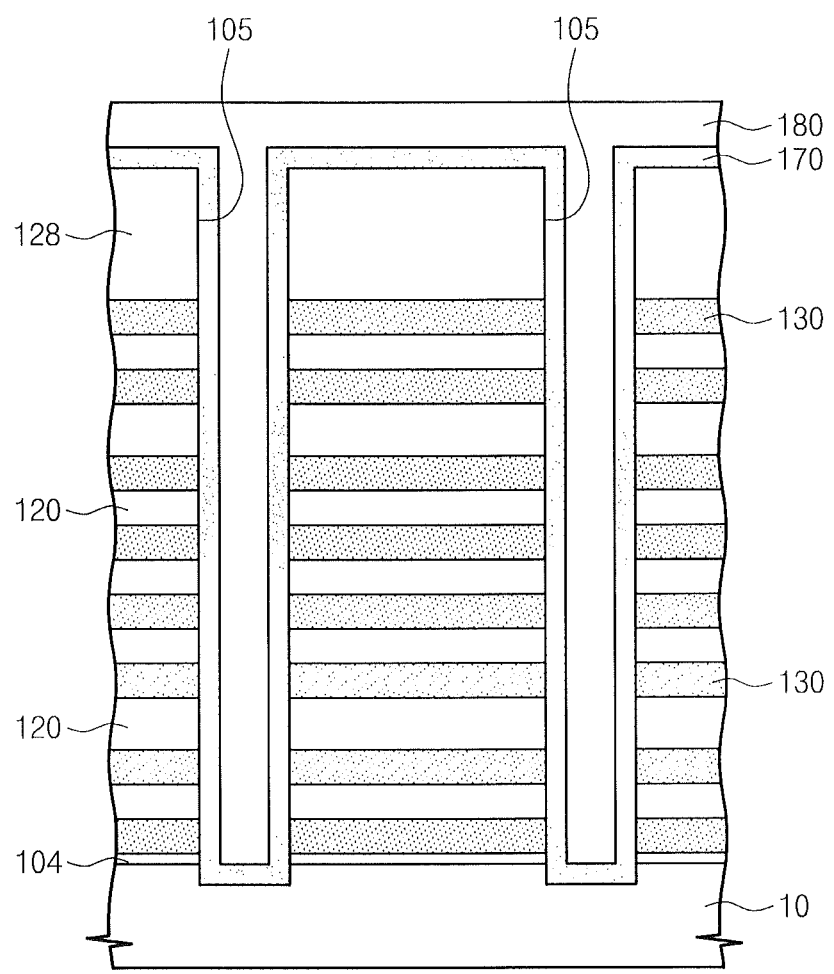

Referring to FIG. 10, a semiconductor layer 170 may be formed to cover the inner walls of the channel holes 105. The semiconductor layer 170 may be a silicon layer (e.g., a polycrystalline silicon layer) formed using one of, for example, atomic layer deposition (ALD) and chemical vapor deposition (CVD). The semiconductor layer 170 may be formed, for example, with a thickness ranging from about 1/50 to 1/5 of the width of the channel holes 105. In some embodiments, the semiconductor layer 170 may be, for example, one of an organic semiconductor layer and carbon nano structures, and it may be formed not to completely fill the channel holes 105. Thereafter, a first gap-filling layer 180 may be formed on the semiconductor layer 170 to fill the channel holes 105. The first gap-filling layer 180 may be one of a spin-on-glass (SOG) insulating layer or a silicon oxide layer. In some embodiments, a hydrogen annealing step may be performed (e.g., before the formation of the first gap-filling layer 180) to thermally treat the resultant structure provided with the semiconductor layer 170 under a gas atmosphere including hydrogen and/or heavy hydrogen. Crystal defects in the semiconductor layer 170 may be cured and/or reduced during the hydrogen annealing.

In some embodiments, the semiconductor layer 170 may be formed to fill the channel holes 105, and the formation of the first gap-filling layer 180 may be omitted.

Figure 11:
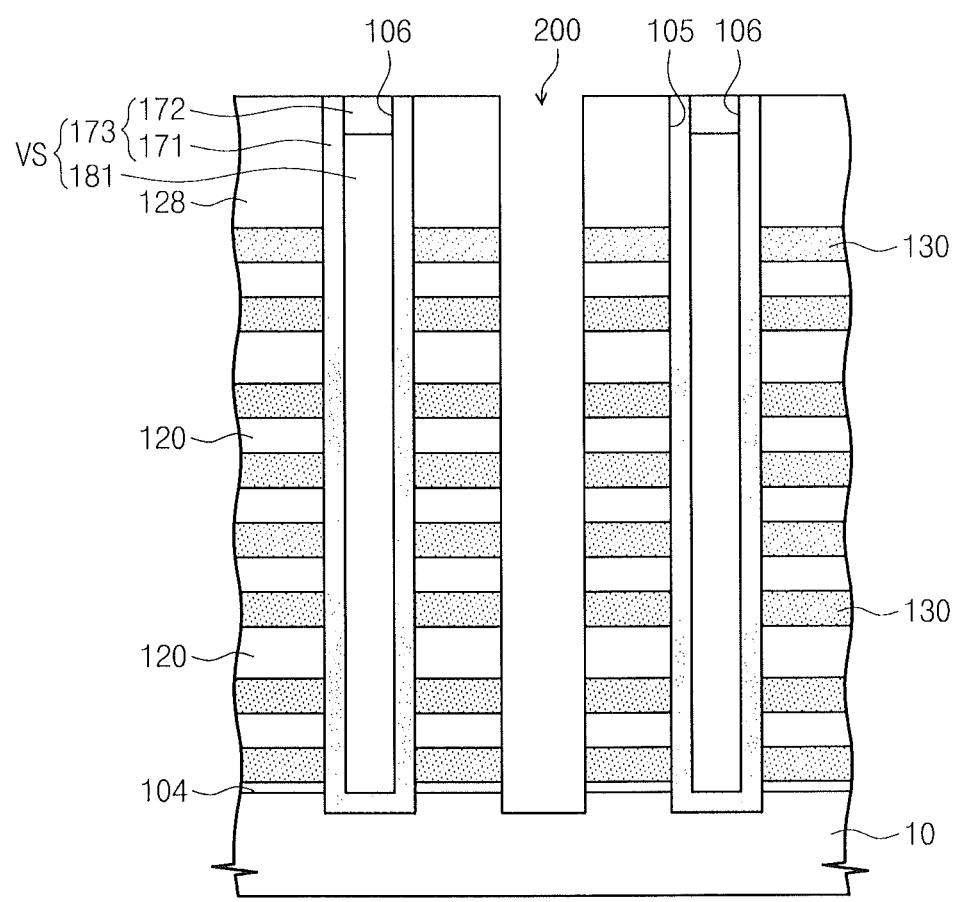

Referring to FIG. 11, the first gap-filling layer 180 may be partially removed to form first gap-filling patterns 181 defining second channel holes 106. The formation of the first gap-filling pattern 181 may include etching the first gap-filling layer 180 in an etch-back manner. In some embodiments, the etching of the first gap-filling layer 180 may be performed in such a way that the first gap-filling pattern 181 may have a top surface positioned at a lower level than that of the top surface of the uppermost insulating layer 128. Thereafter, a semiconductor layer (not shown) may be formed to fill the second channel holes 106 and then be planarized to remove the semiconductor layer 170 from the top surface of the uppermost insulating layer 128. As the result of the planarization, a first semiconductor pattern 171 and a second semiconductor pattern 172 may be formed in the second channel holes 106. The second semiconductor pattern 172 may be disposed on the first gap-filling pattern 181 to fill the second channel holes 106. The first and second semiconductor patterns 171 and 172 may constitute an active pattern 173, and the active patterns 173 and the first gap-filling pattern 181 may constitute a first structures VS. In some embodiments, the active patterns 173 may be p-type or intrinsic.

The mold structure may be patterned to form trenches 200 exposing the substrate 10. In some embodiments, the trenches 200 may be formed spaced apart from the first structures VS (e.g., between the first structures VS). The formation of the trench 200 may include forming an etch-mask on the mold structure, and anisotropically etching layers below the etch-mask to, for example, expose the top surface of the substrate 10. In some embodiments, as shown in FIG. 11, a top surface of the substrate 10 defining a bottom surface of the trench 200 may be recessed by over-etching during anisotropic etching of the layers below the etch mask.

Figure 12:
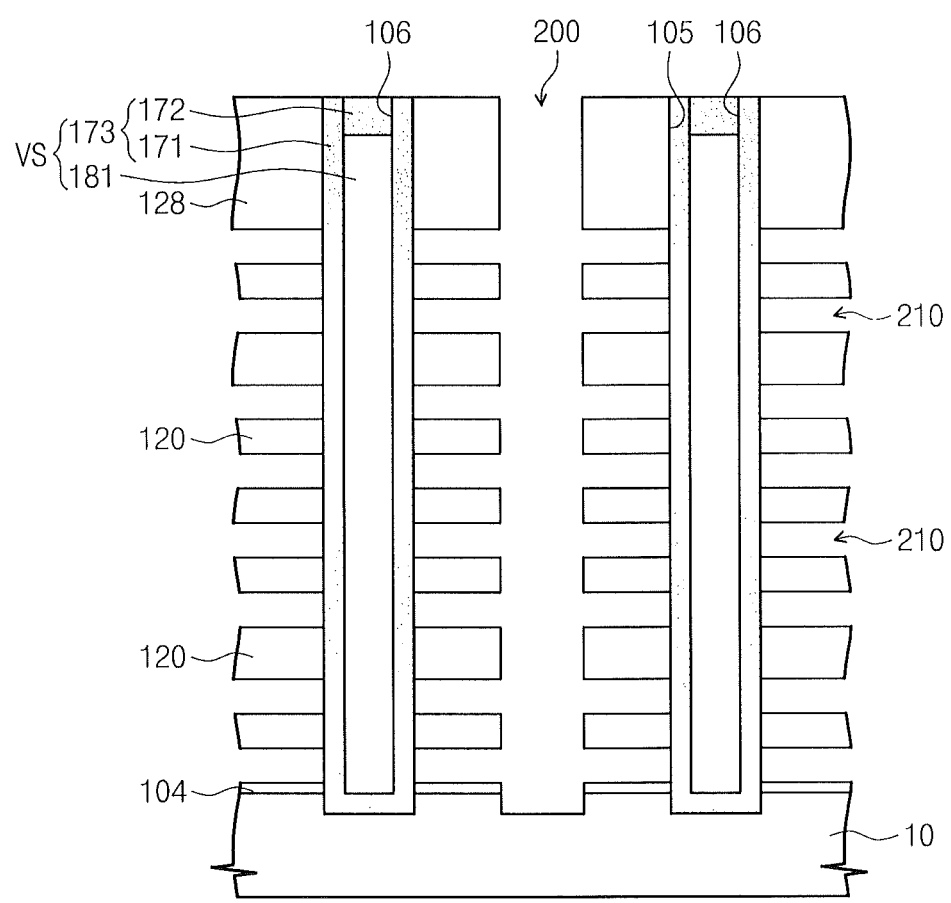

Referring to FIG. 12, recess regions 210 may be formed between the insulating layers 120 by selectively removing the sacrificial layers 130 exposed by the trenches 200. In more detail, an outer boundary of the recess region 210 may be defined by the insulating layers 120 and the trenches 200, and an internal boundary of the recess region 210 may be defined by the active patterns 173.

The formation of the recess regions 210 may include horizontally etching the sacrificial layers 130 using, for example, an etchant and/or etch process with etch selectivity to the insulating layers 120 and the active patterns 173. For example, in the case that the sacrificial layers 130 are formed of silicon nitride and the insulating layers 120 are formed of silicon oxide, the horizontal etch may be performed using an etchant including phosphoric acid.

Figure 13:
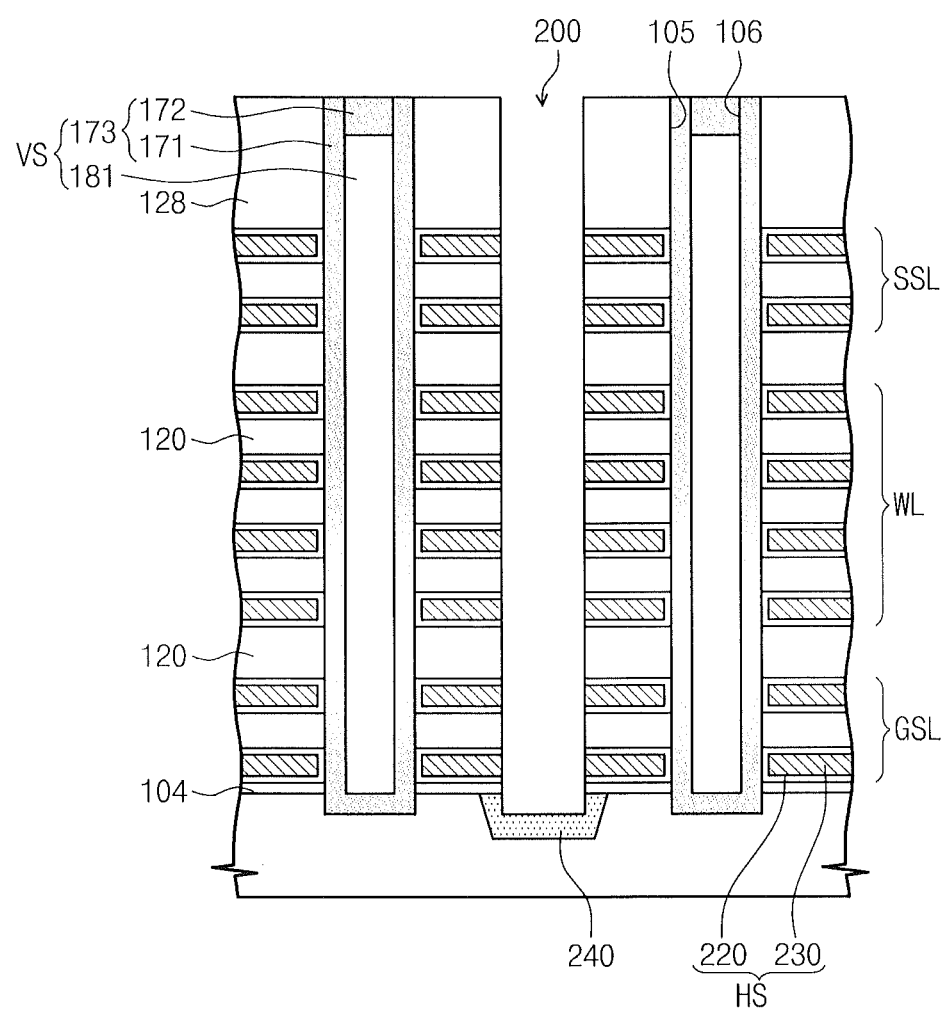

Referring to FIG. 13, second structures HS may be formed to fill the recess regions 210. The second structures HS may include a memory layer 220 covering the inner walls of the recess region 210 and a conductive patterns 230 filling the remaining space of the recess region 210.

The formation of the second structures HS may include sequentially forming the memory layer 220 and a conductive layer to fill the recess regions 210, and removing the conductive layer from the trenches 200 to remain the conductive patterns 230 in the recess regions 210. Technical features related to the memory layer 220 will be described in more detail with reference to FIGS. 26 through 28. The conductive layer may be formed to fill the recess regions 210 covered by the memory layer 220. The trenches 200 may be completely and/or partially filled by the conductive layer. The conductive layer may include, for example, doped silicon, metallic materials, metal nitride layers, and/or metal silicide. For example, the conductive layer may include at least one layer of tantalum nitride and/or tungsten. In some embodiments, the conductive layer may be formed to conformally cover the inner walls of the trench 200, and the forming of the conductive patterns 230 may include removing the conductive layer from the trench 200 using, for example, an isotropic etching process. In other embodiments, the conductive layer may be formed to fill the trench 200, and the forming of the conductive patterns 230 may include anisotropically etching the conductive layer to selectively remove the conductive layer from the trench 200.

Third doped regions 240 may be formed in the substrate 10 exposed by the trenches 200. The third doped region 240 may have a different conductivity type from the substrate 10 (for instance, n-type). The third doped region 240 may be formed using an ion implantation process.

Figure 14:
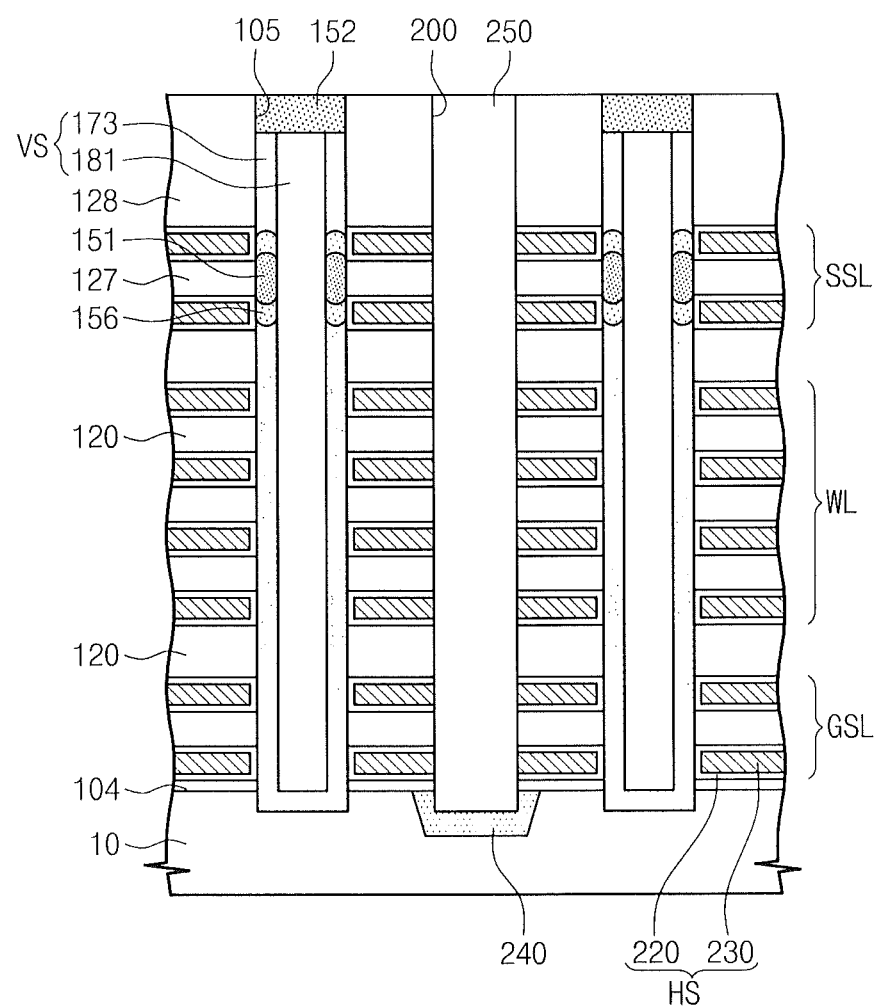

Referring to FIG. 14, second gap-filling patterns 250 may be formed to fill the trenches 200. The formation of the second gap-filling patterns 250 may include forming an insulating layer on the resultant structure provided with the trenches 200, and then etching the insulating layer to expose the top surface of the uppermost insulating layer 128. The second gap-filling pattern 250 may be formed of, for example, at least one of a silicon oxide layer, a silicon nitride layer, and a silicon oxynitride layer, and the etching of the insulating layer may be performed using a planarization technique, for example, a chemical-mechanical polishing technique and/or an etch-back technique.

Second impurity injection regions 152 may be formed in an upper portion of the active patterns 173. The formation of the second impurity injection region 152 may include doping the upper portion of the active patterns 173 with impurities, whose conductivity type is different from the substrate 10. In some embodiments, the second impurity injection region 152 may be doped with impurities of n-type. The second impurity injection region 152 may be formed using an ion implantation process or a diffusion process.

A diffusion-resistant impurity injection region 156 may be formed in the active patterns 173 adjacent the string selection lines SSL. The formation of the diffusion-resistant impurity injection region 156 may include injecting carbon (C) into the active patterns 173 adjacent the string selection lines SSL. For instance, the diffusion-resistant impurity injection region 156 may be formed using an ion implantation process.

A first impurity injection region 151 may be formed in the active patterns 173 adjacent the string selection lines SSL. The formation of the first impurity injection region 151 may include injecting p-type impurities into the active patterns 173 adjacent the string selection lines SSL. For instance, the p-type impurity may be boron (B), and the first impurity injection region 151 may be formed using an ion implantation process.

Doping concentrations and/or injection depths of the first and second impurity injection regions 151 and 152 and the diffusion-resistant impurity injection region 156 (hereinafter, impurity injection regions) may be determined with reference to FIGS. 4 through 7.

Referring back to FIGS. 2 and 3, an annealing process may be performed on the resultant structure provided with the impurity injection regions 151, 152 and 156. The annealing process may cure lattice defects in the active patterns 173, which may occur during the ion implantation processes for forming the impurity injection regions 151, 152 and 156. In the meantime, impurities in the impurity injection regions 151, 152 and 156 may be diffused as a result of the annealing process or a subsequent thermal process, which may be performed after forming the impurity injection regions 151, 152 and 156. After the annealing and thermal processes, the impurity injection regions 151, 152 and 156 may expand to serve as the first doped region 154, the second doped region 155, and the diffusion-resistant doped region 157, respectively, which were described with reference to FIG. 3. For instance, some of p-type impurities in the second impurity injection region 152 may be diffused downward to form the impurity extension region 153 extended below a top surface of the first gap-filling pattern 181.

Upper plugs 275 may be formed on the first structures VS, respectively, and upper interconnection lines 270 may be formed on the upper plugs 275 to connect the upper plugs 275 with each other. The formation of the upper plugs 275 may include forming an interlayer dielectric 273 to have openings exposing the second doped regions 155, and filling the opening with a conductive material. The upper plugs 275 may be formed of at least one of doped silicon and metallic materials. Each of the upper interconnection lines 270 may be electrically connected to the corresponding one of the first structures VS, via the corresponding one of the upper plugs 275. The upper interconnection lines 270 may be formed to cross the second structures HS or the trench 200. According to some embodiments of the inventive concept with respect to a NAND flash memory, the upper interconnection lines 270 may serve as the bit lines connected to upper ends of cell strings.

As described above, carbon atoms in the diffusion-resistant doped region 157 may suppress the p-type impurities in the first doped region 154 from being diffused. That is, an expansion of the first impurity injection region 151 can be effectively suppressed. Accordingly, it is possible to prevent or reduce a doping profile from being changed by the impurity diffusion, which may enable a suppression the electric resistance of the channel connecting region from being increased.

Figure 15:
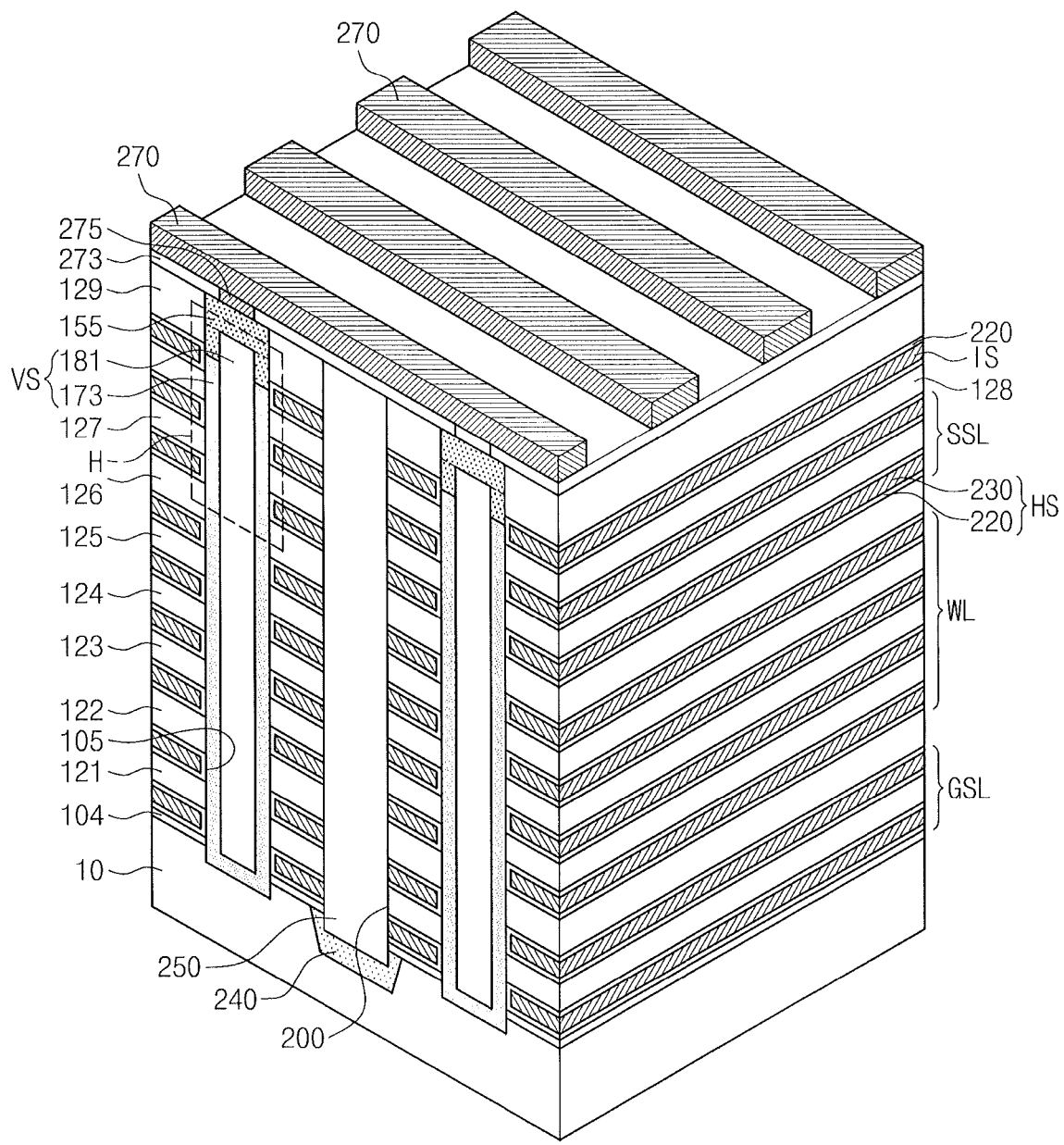
Figure 16:
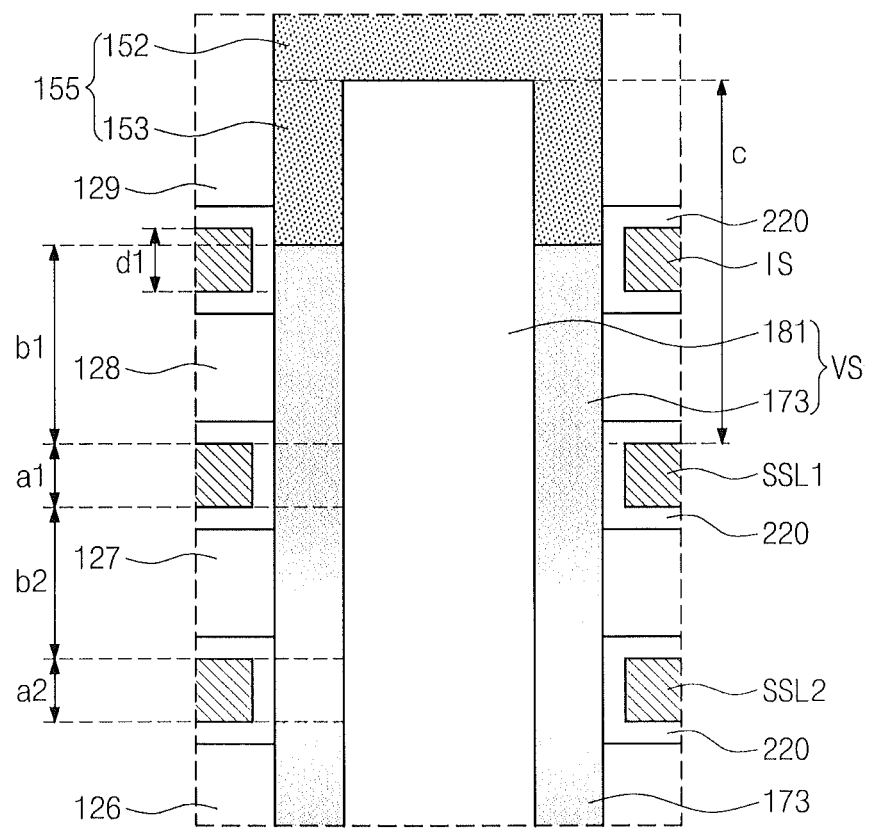
Figure 17:
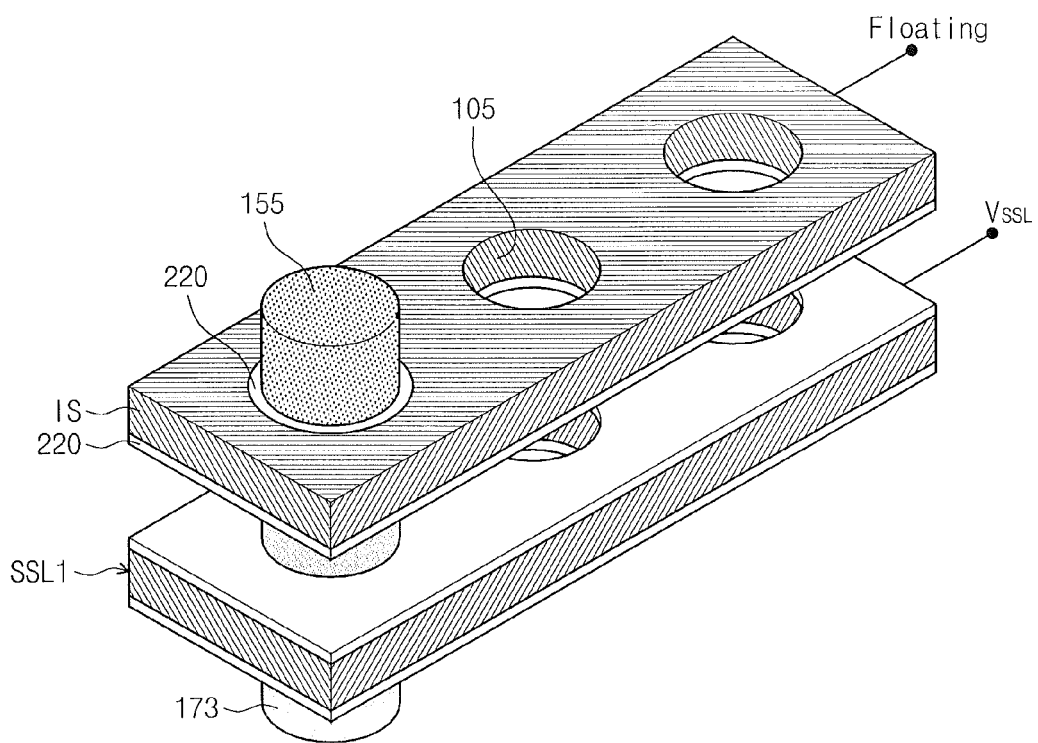

FIG. 15 is a perspective view of a three-dimensional semiconductor device according to some embodiments of the inventive concept, FIG. 16 is an enlarged sectional view of a portion H of FIG. 15, and FIG. 17 is an enlarged perspective view exemplarily illustrating some of elements depicted in FIG. 15. For convenience in description, the aforesaid technical features may be omitted below.

Referring to FIGS. 15 and 17, an inversion inducing pattern IS may be provided on the substrate 10. The inversion inducing pattern IS may be in an electrically floating state. The inversion inducing pattern IS may be disposed between the first string selection line SSL1 and the second impurity injection region 152.

In some embodiments, the impurity extension region 153 may be formed by a downward diffusion of impurities in the second impurity injection region 152. However, in the case that there is a difference between the diffusion length and the first string selection line SSL1 formed adjacent the impurity extension region 153, the string selection transistors may exhibit position-dependent operational characteristics (e.g., a leakage current property). To reduce this position-dependence, as shown in FIG. 16, a distance c from a top surface of the first string selection line SSL1 to a top surface of the first gap-filling pattern 181 may be greater than a distance between the string selection lines and/or a distance between the word lines.

The increase of the distance c may make it difficult to form the inversion region in the first channel connecting region b1 or to uniformly form the inversion region. This may lead to an increase in electric resistance of the first channel connecting region b1.

According to some embodiments of the inventive concept, the inversion inducing pattern IS in the floating state may be provided between the first string selection line SSL1 and the second doped region 155.

In operation, if a specific voltage of $V_{SSL}$ is applied to the first string selection line SSL1, the inversion inducing pattern IS can have a boosted potential, due to a capacitive coupling between the first string selection line SSL1 and the inversion inducing pattern IS. This may enable an easy and uniform forming of the inversion region in a portion d1 of the active patterns 173 adjacent the inversion inducing pattern IS.

In some embodiments, in view of vertical position, a portion of the inversion inducing pattern IS may be overlapped with the second doped region 155. Unlike the case that the first string selection line SSL1 is vertically overlapped with the second doped region 155, the vertical overlap between the inversion inducing pattern IS and the second doped region 155 may not cause a problem of leakage current. Accordingly, there is no necessity for increasing the distance c, even when the inversion inducing pattern IS is disposed between the first string selection line SSL1 and the second doped region 155. In other embodiments, unlike shown in FIGS. 15 and 16, the inversion inducing pattern IS may not be overlapped with the second doped region 155, in terms of vertical position.

The inversion inducing pattern IS may be formed to surround the first structures VS. For instance, as shown in FIG. 17, the inversion inducing pattern IS may be shaped like a plate extending parallel to the conductive patterns 230 and a plurality of the active patterns 173 may be formed to penetrate the inversion inducing pattern IS. In addition, an insulating layer may be provided between the inversion inducing pattern IS and the active patterns 173. In some embodiments, the memory layer 220 described above may be used as the insulating layer, but embodiments of the inventive concept are not so limited. For instance, the insulating layer may be variously modified in terms of shape or material.

The inversion inducing pattern IS may include a conductive material. For instance, the inversion inducing pattern IS may include at least one of a metal layer, a conductive metal nitride layer, or a doped silicon layer. In some embodiments, the inversion inducing pattern IS may be formed of the same material as the conductive patterns 230.

A shape, material, and position of the inversion inducing pattern IS may not limited to the above-described embodiments. That is, the inventive concept can be realized in various manners, based on a method using the afore-described capacitive coupling to easily or uniformly form the inversion region in the active patterns 173.

Figure 18:
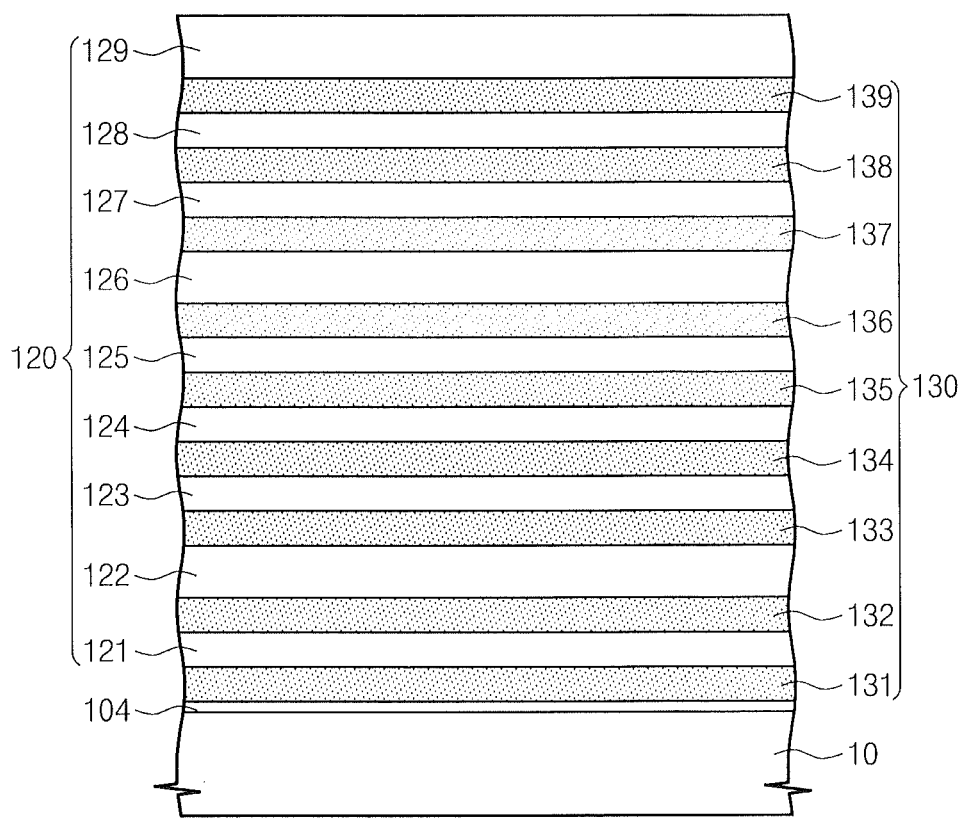
Figure 19:
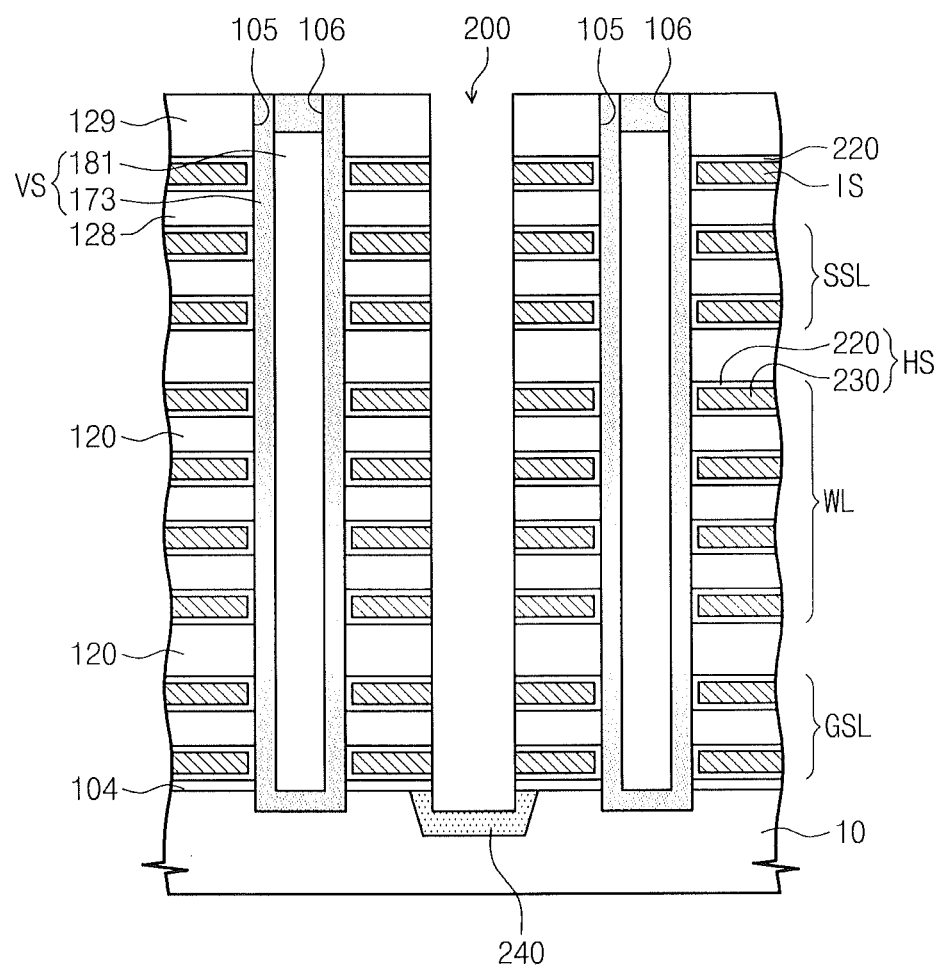
Figure 20:
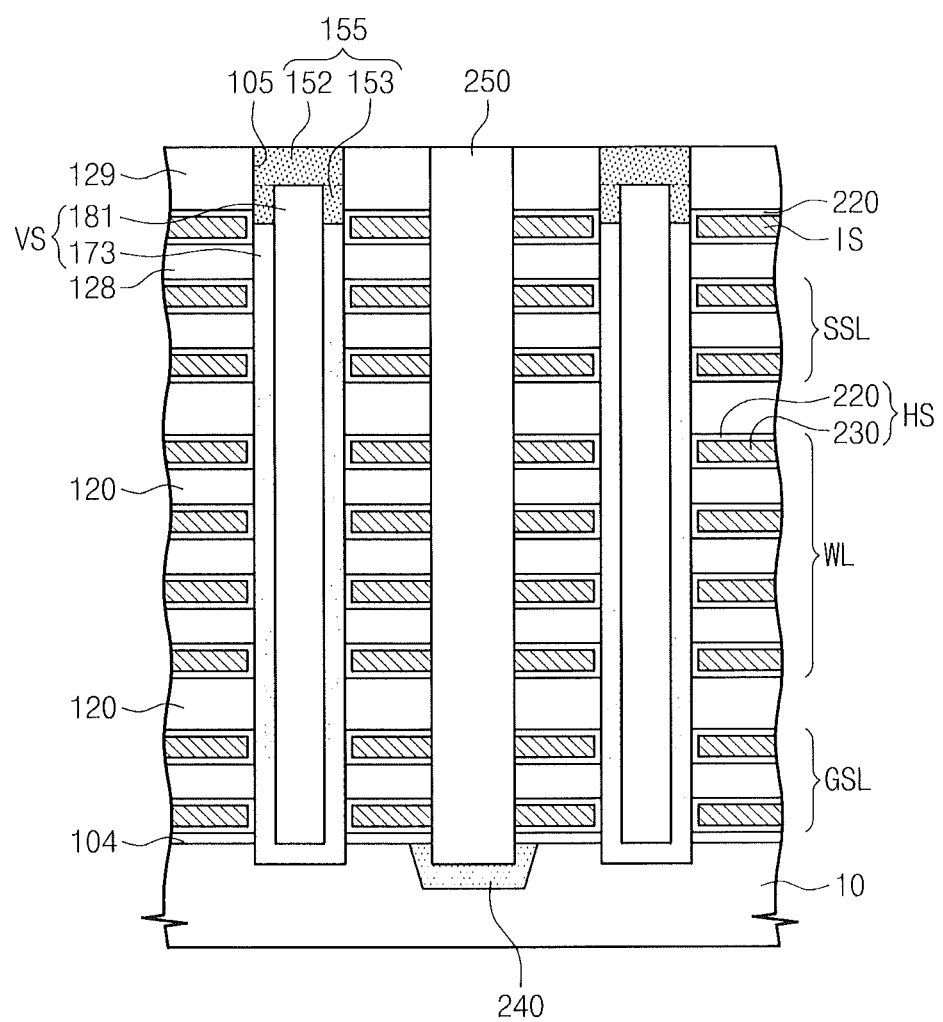

FIGS. 18 through 20 are sectional views illustrating methods of fabricating a three-dimensional semiconductor device according to some embodiments of the inventive concept. For convenience in description, the aforesaid technical features may be omitted below.

Referring to FIG. 18, sacrificial layers 130 and insulating layers 120 may be alternatingly stacked on the substrate 10. In these embodiments, it will be assumed that the sacrificial layers 130 include first to ninth sacrificial layers 131-139 sequentially stacked on the substrate 10 and the insulating layers 120 include first to ninth insulating layers 121-129 sequentially stacked on the substrate 10. The sacrificial layers 130 and the insulating layers 120 may be a portion of the mold structure. A buffer layer 104 may be provided between the first sacrificial layer 131 and the substrate 10. In some embodiments, the buffer layer 104 may be formed of silicon oxide. The uppermost (i.e., ninth) insulating layer 129 may be thicker than the others of the insulating layers 121-128. Some embodiments provide that the uppermost insulating layer 129 may have the same thickness as the first insulating layer 121.

The processes described with reference to FIGS. 9 through 13 may be performed on the resultant structure provided with the sacrificial layers 130 and the insulating layers 120 to, as shown in FIG. 19, form a structure including the inversion inducing pattern IS disposed in an upper portion of the mold structure and the memory layer 220 interposed between the inversion inducing pattern IS and the active patterns 173.

Referring to FIG. 20, a second doped region 155 may be formed in an upper portion of the active patterns 173. The second doped region 155 may include the impurity extension region 153, which may be partially overlapped with the inversion inducing pattern IS, in terms of vertical position. The third doped region 240 may be formed in the substrate 10 exposed by the trench 200, and the second gap-filling pattern 250 may be formed to fill the trench 200. Although not illustrated, the inversion inducing pattern IS may be in an electrically floating state, while the selection lines SSL and GSL and the word lines WL may be electrically connected to other active devices disposed with the semiconductor device.

According to some embodiments of the inventive concept, the inversion inducing pattern IS can be formed using the process for forming the conductive patterns 230. That is, there is no necessity to perform an additional process for the inversion inducing pattern IS.

Figure 21:
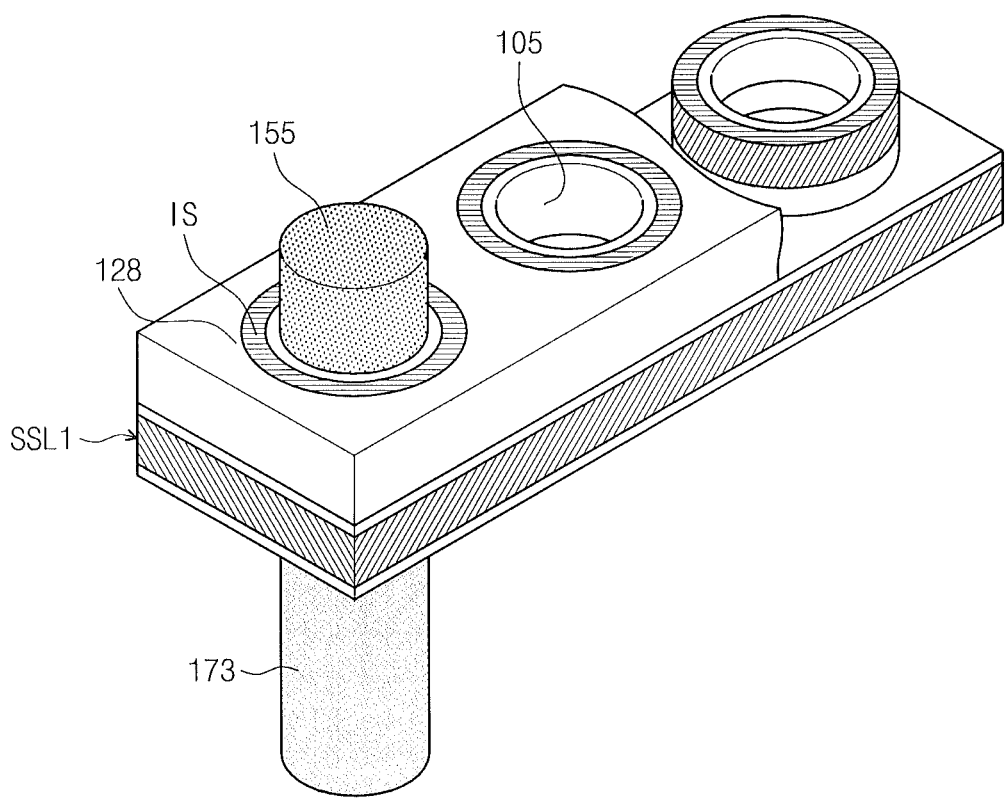
Figure 22:
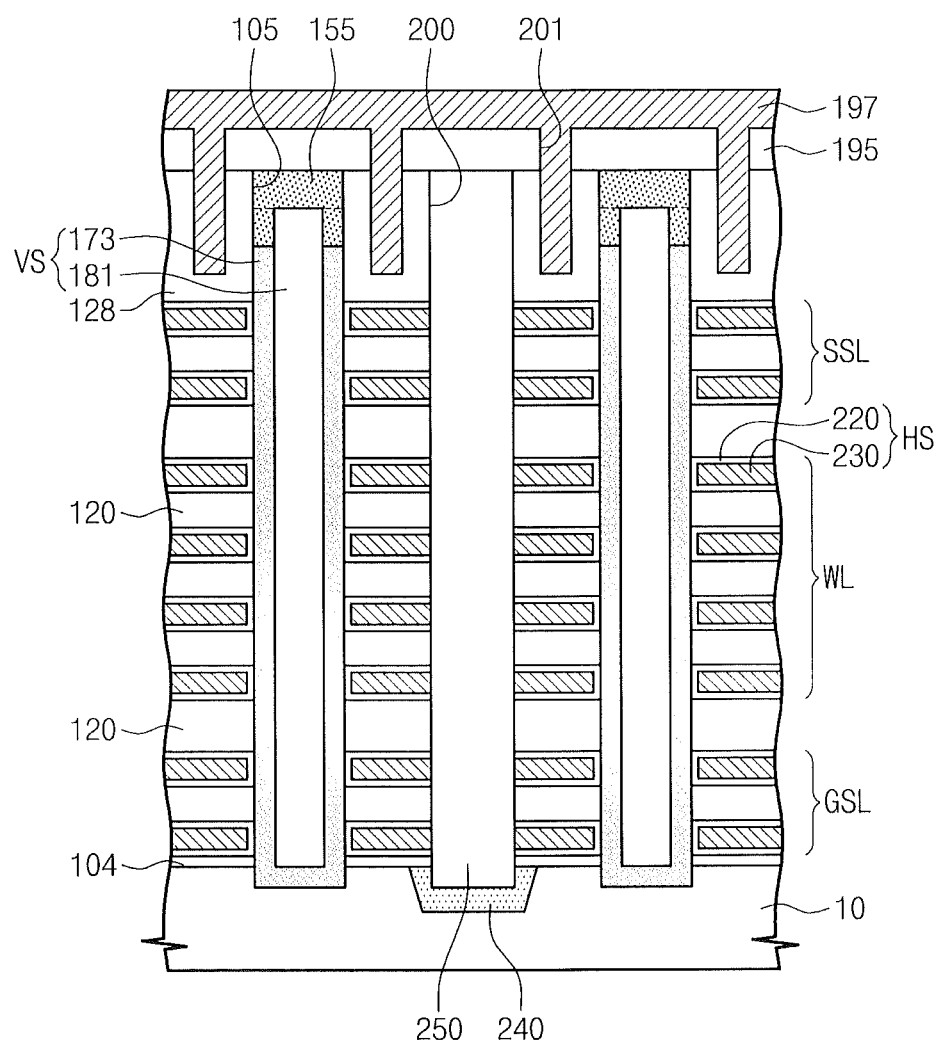
Figure 23:
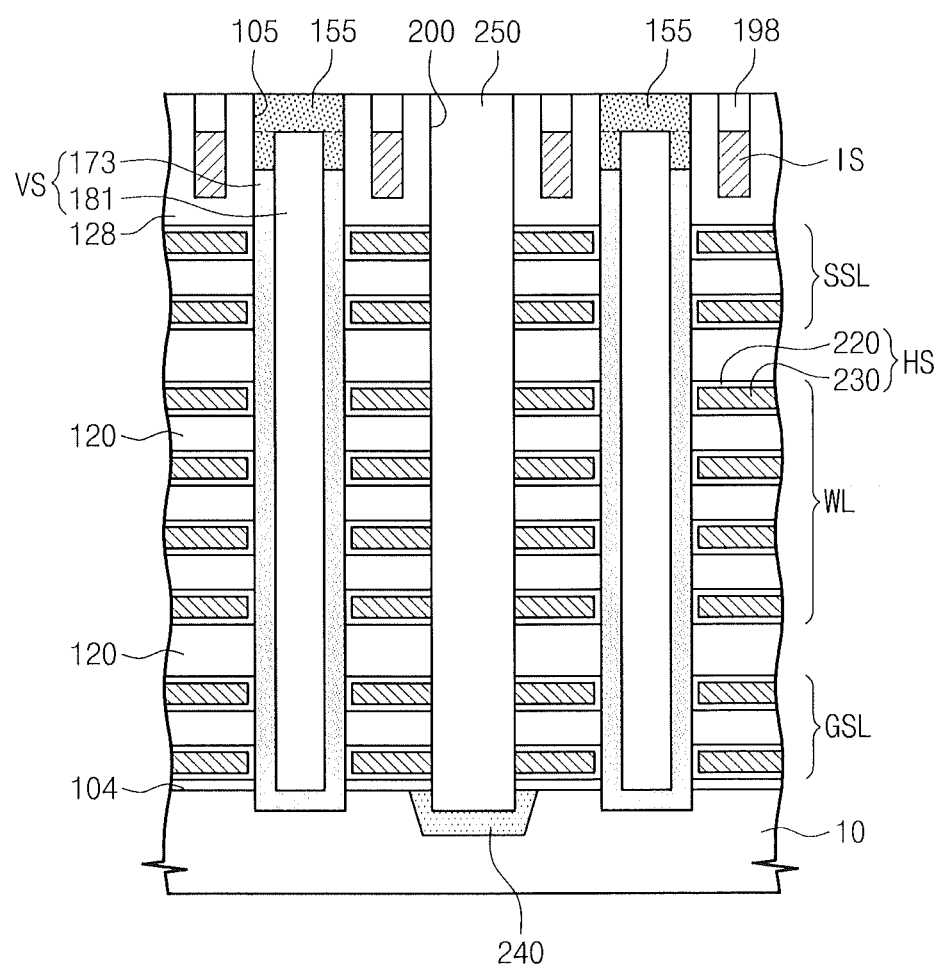

FIG. 21 is a perspective view of a three-dimensional semiconductor device according to some embodiments of the inventive concept, and FIGS. 22 and 23 are sectional views exemplarily illustrating methods of fabricating a three-dimensional semiconductor device according to some embodiments of the inventive concept. For convenience in description, the aforesaid technical features may be omitted below.

As shown in FIG. 21, the inversion inducing patterns IS may be separated from each other, while each of the inversion inducing patterns IS may be formed to surround the corresponding one of the active patterns 173. In some embodiments, the inversion inducing patterns IS may not be connected with each other, or each of the inversion inducing patterns IS may be in an electrically floating state. Accordingly, the inversion inducing pattern IS can be further freely and variously modified in terms of shape.

As shown in FIG. 22, an inversion inducing layer 197 may be formed on the structure shown in FIG. 14. The formation of the inversion inducing layer 197 may include forming a mask layer 195 on the uppermost insulating layer 128, etching the uppermost insulating layer 128 using the mask layer 195 as an etch-mask to form a second recess region 201, and filling the second recess region 201 with the inversion inducing layer 197. The second recess region 201 may be formed to have a ring shape as that of the inversion inducing pattern IS as shown in FIG. 21, but embodiments of the inventive concept may not be limited thereto. In some embodiments, the inversion inducing layer 197 may be formed of at least one of a metal layer, a conductive metal nitride layer, or a doped silicon layer.

Referring to FIG. 23, an upper portion of the inversion inducing layer 197 may be partially removed to form the inversion inducing pattern IS, which may be confined within the second recess region 201 having the ring shape. In some embodiments, a third gap-filling pattern 198 may be formed to fill an upper portion of the second recess region 201, which is not filled with the inversion inducing pattern IS. Thereafter, a planarization process may be performed to expose the uppermost insulating layer 128.

In some embodiments, the inversion inducing pattern IS may be formed using a spacer forming process. For instance, the formation of the inversion inducing pattern IS may include etching a top surface of the uppermost insulating layer 128 to expose an outer sidewall of the first structures VS, sequentially forming an insulating layer and an inversion inducing layer on the resultant structure, and then anisotropically etching the inversion inducing layer and the insulating layer.

According to some embodiments, as shown in FIG. 21, the inversion inducing patterns IS may be formed spaced apart from each other, and each of them may be formed to surround the corresponding one of active patterns 173.

Figure 24:
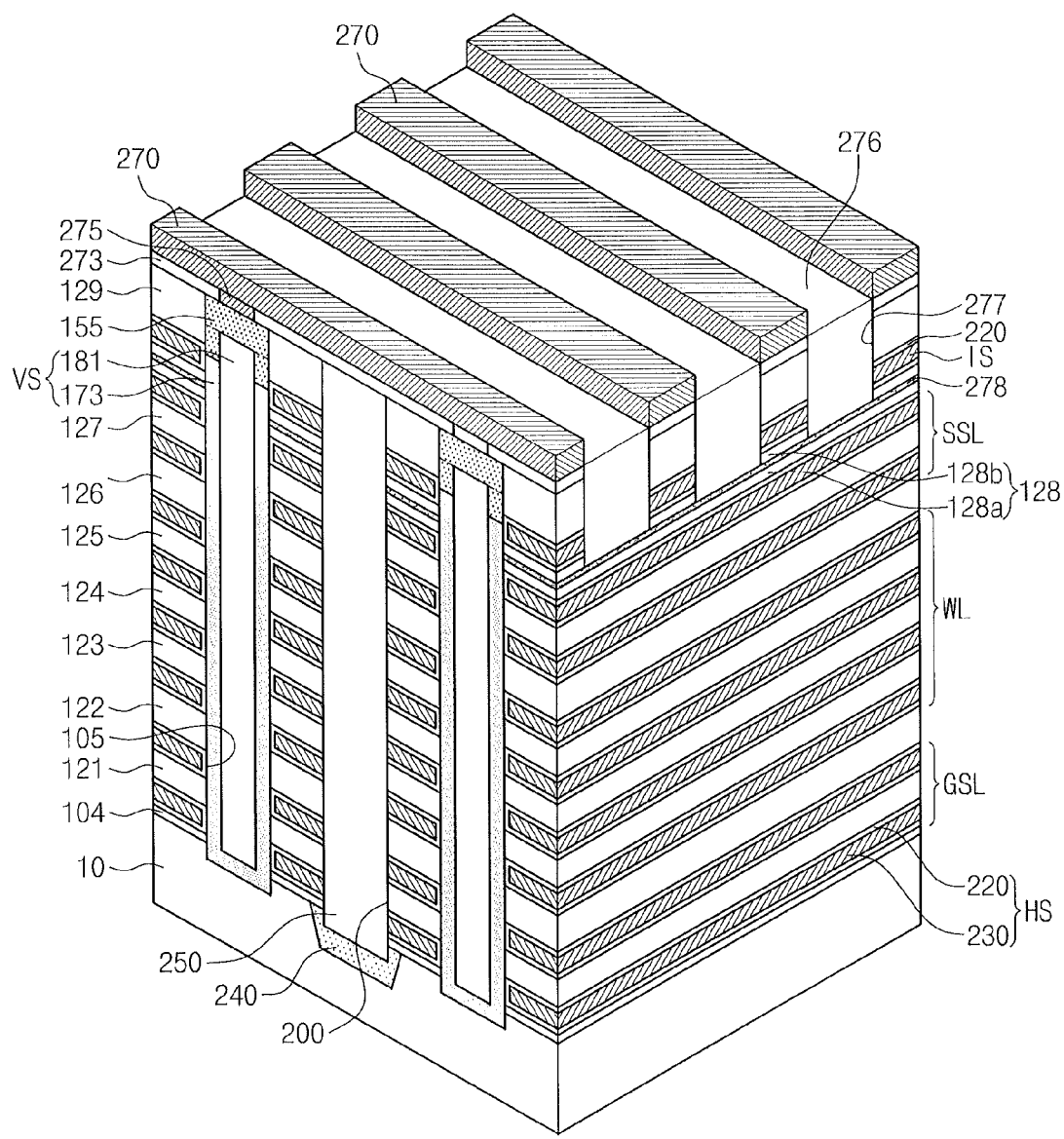

FIG. 24 is a perspective view of a three-dimensional semiconductor device according to some embodiments of the inventive concept. For convenience in description, the aforesaid technical features may be omitted below.

Referring to FIG. 24, fourth gap-filling patterns 276 may be formed parallel to the upper interconnection lines 270 to cross the string selection lines SSL. The fourth gap-filling pattern 276 may be formed of at least one of silicon oxide or silicon nitride. The formation of the upper interconnection lines 270 may include patterning the uppermost insulating layer 129 and the inversion inducing pattern IS to form grooves 277 crossing the string selection lines SSL. In some embodiments, the method may further include forming an intermediate layer 278 between the string selection line SSL and the inversion inducing pattern IS, and the formation of the grooves 277 may include an anisotropic etching process using the intermediate layer 278 as an etch stop layer. The fourth gap-filling pattern 276 may be formed in the groove 277. According to some embodiments, the inversion inducing patterns IS may be horizontally separated by the grooves 277 or the fourth gap-filling patterns 276 as well as by the trenches 200 or the second gap-filling patterns 250. That is, the inversion inducing patterns IS may be arranged two-dimensionally spaced apart from each other, and each of them may be formed to surround the corresponding one of active patterns 173.

Figure 25:
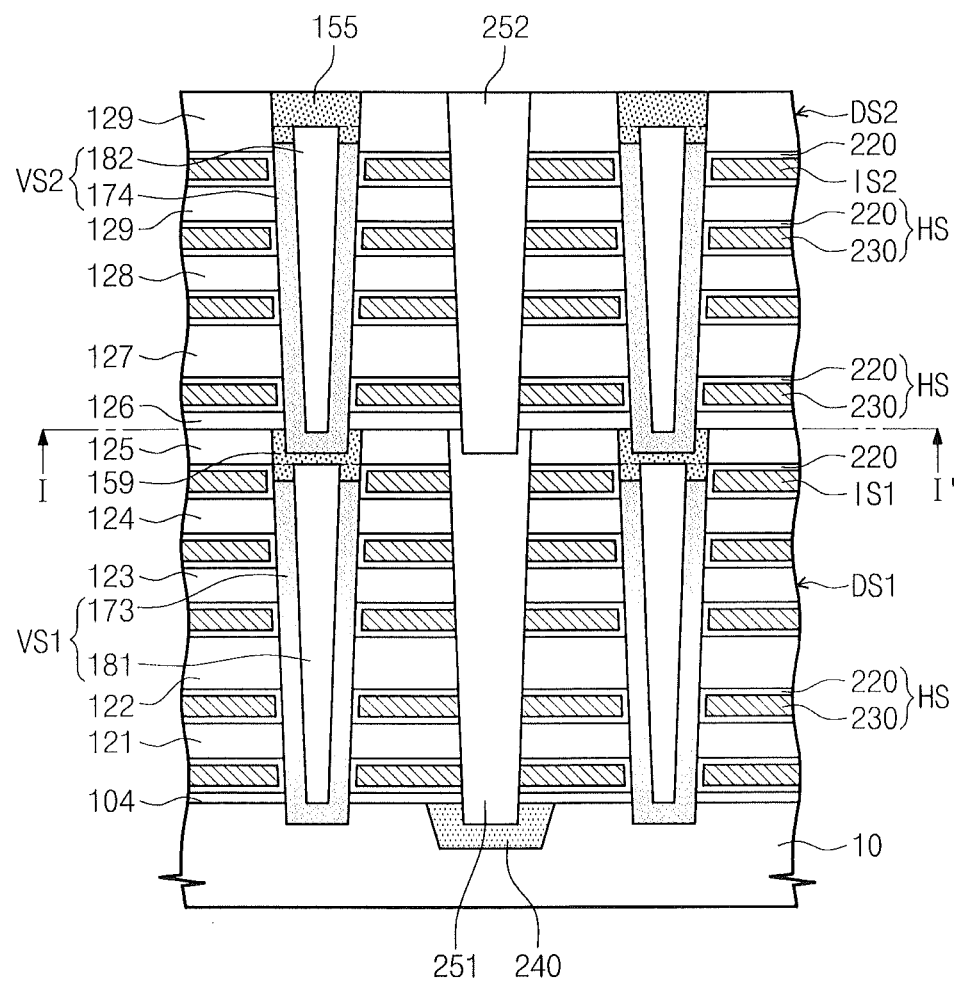

FIG. 25 is a sectional view presented to describe three-dimensional semiconductor devices and fabricating methods thereof, according to some embodiments of the inventive concept. Referring to FIG. 25, a three-dimensional semiconductor device may include a first stacking structure DS1 and a second stacking structure DS2, which are sequentially stacked on the substrate 10. A line I-I' in FIG. 25 represents an interface between the first and second stacking structures DS1 and DS2.

The first and second stacking structures DS1 and DS2 may include the second structures HS. The second structures HS may include the conductive patterns 230 and the memory layer 220.

The three-dimensional semiconductor device may further include first structures VS1 and VS2 penetrating the first and second stacking structures DS1 and DS2, respectively. The first structures VS1 and VS2 may include first active patterns 173 and second active patterns 174, respectively. In addition, the first structures VS1 and VS2 may include first gap-filling patterns 181 and 182, respectively. The three-dimensional semiconductor device may further include second gap-filling patterns 251 and 252 crossing the first and second stacking structures DS1 and DS2, respectively.

A second doped region 155 may be provided in an upper portion of the second active pattern 174, and a second inversion inducing pattern IS2 may be formed adjacent the second doped region 155. The second inversion inducing pattern IS2 may induce an inversion region in the channel connecting region, and as a result, an electric resistance of the channel connecting region can be reduced.

The second active pattern 174 may be electrically connected to the first active pattern 173 via a connection pad 159. The connection pad 159 may be a doped region having a different conductivity type from the substrate 10. For instance, the connection pad 159 may be n-type. Similar to the second active pattern 174, n-type impurities in the connection pad 159 may be downward diffused. A first inversion inducing pattern IS1 may be provided adjacent the connection pad 159. The first inversion inducing pattern IS1 may be provided between a pair of vertically separated conductive patterns disposed adjacent the connection pad 159. If a specific voltage is applied to the conductive pattern disposed adjacently below the first inversion inducing pattern IS1, the first inversion inducing pattern IS1 can be capacitively coupled with the conductive pattern to induce an inversion region in the first active pattern 173. This may enable a reduction of a leakage current in the first active pattern 173 and an electric resistance of the first active pattern 173.

Figure 26:
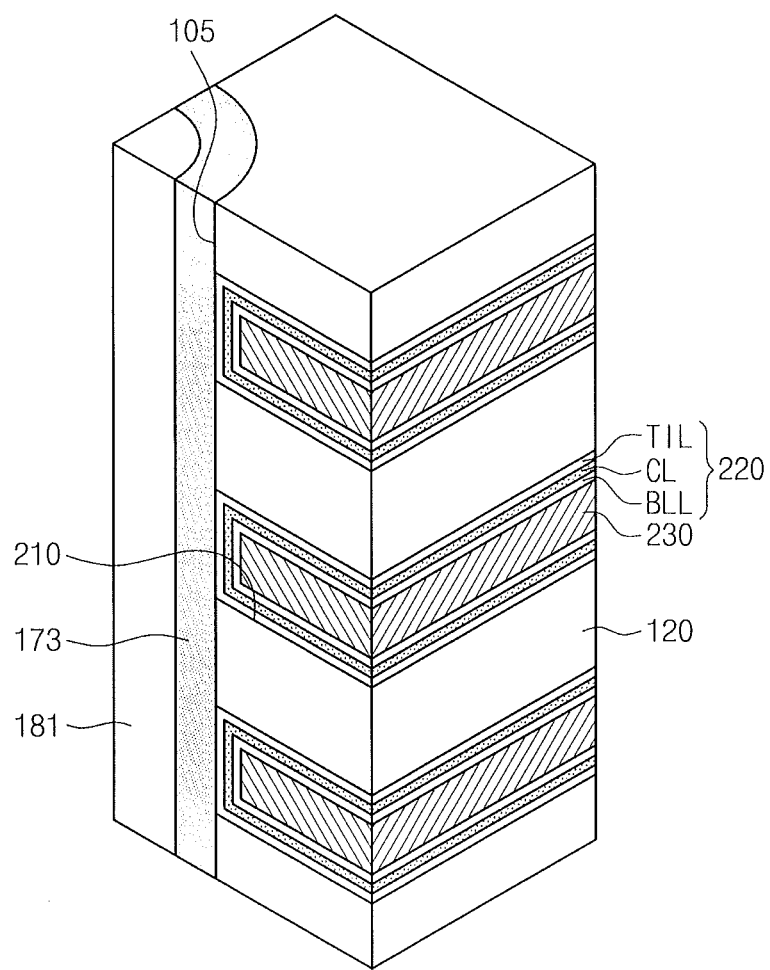
Figure 27:
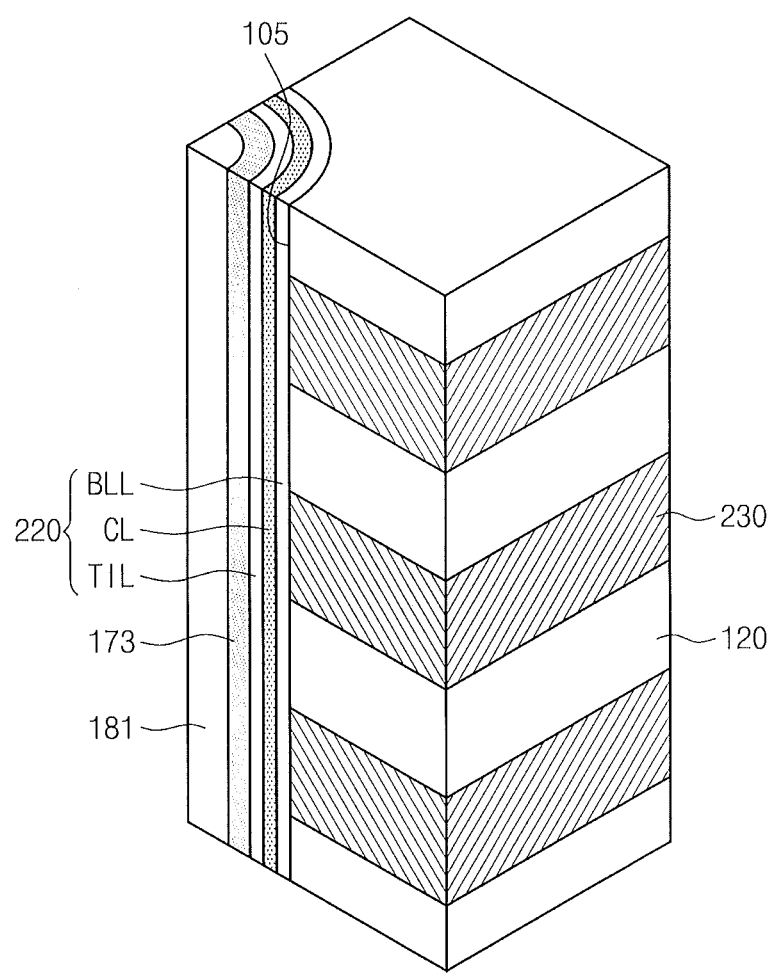
Figure 28:
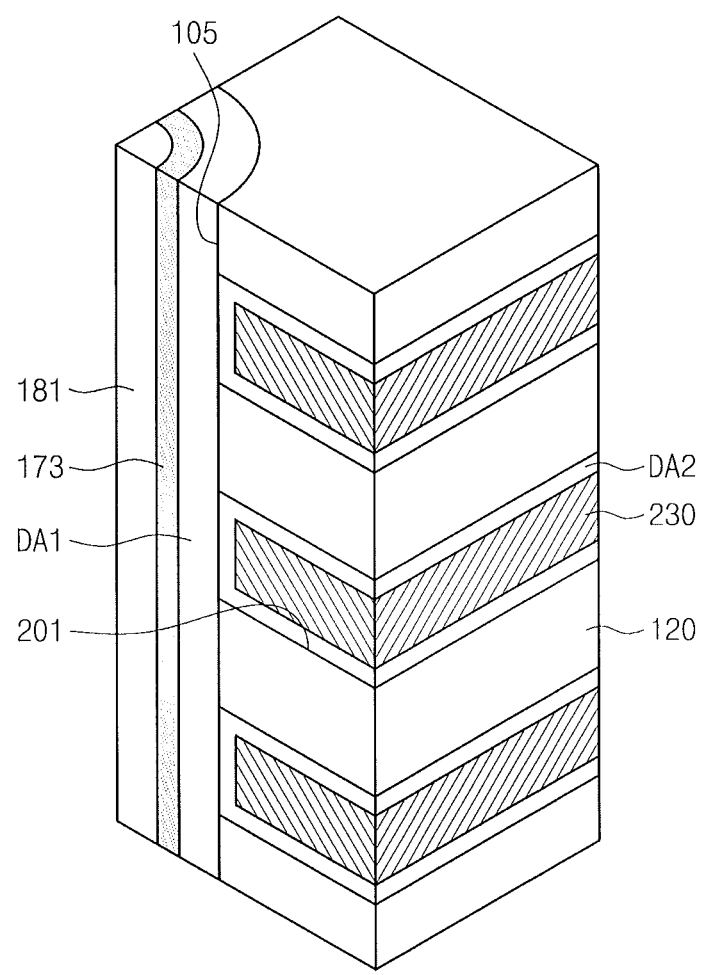

FIGS. 26 through 28 are enlarged perspective views exemplarily illustrating memory layers according to some embodiments of the inventive concept.

Referring to FIG. 26, at least one of the first and second structures may include the memory layer 220 disposed on a sidewall of the channel holes 105. The memory layer 220 may include a tunnel insulating layer TIL, a charge storing layer CL, and a blocking insulating layer BLL, which are sequentially stacked on the recess region 210. Layers constituting the memory layer 220 may be formed using a deposition technique providing, for example, excellent and/or improved step-coverage property (e.g., a CVD and/or ALD technique).

The charge storing layer CL may be one or more insulating layers with abundant trap sites and/or one or more insulating layers with nano particles and may be formed, for example, by CVD and/or ALD. For example, the charge storing layer CL may include one of a trap insulating layer and/or an insulating layer with a floating gate electrode and/or conductive nano dots. In some embodiments, the charge storing layer CL may include a silicon nitride layer, a silicon oxynitride layer, a silicon-rich nitride layer, a nano crystalline silicon layer, and/or a laminated trap layer.

The tunnel insulating layer TIL may be one of materials with a higher band gap than the charge storing layer CL, and may be formed by, for example, CVD and/or ALD. For example, the tunnel insulating layer TIL may be a silicon oxide layer. The tunnel insulating layer TIL may undergo a thermal treatment performed after a deposition process. The thermal treatment process may be, for example, a rapid thermal nitridation (RTN) process and/or an annealing process in an atmosphere including nitrogen and/or oxygen.

In some embodiments, the blocking insulating layer BLL may be a single-layered insulating layer. In other embodiments, the blocking insulating layer BLL may be formed to have a multi-layered structure, for instance, including first and second blocking insulating layers (not shown). The first and second blocking insulating layers may be different materials, and one of them may be one of materials having a smaller band bap than the tunnel insulating layer TIL and a larger band gap than the charge storing layer CL. The first and second blocking insulating layers may be formed by, for example, CVD and/or ALD, and at least one of them may be formed by wet oxidation. In some embodiments, the first blocking insulating layer may be one of high-k dielectric layers (e.g., an aluminum oxide layer and/or a hafnium oxide layer), and the second blocking insulating layer may be, for example, a material with a smaller dielectric constant than the first blocking insulating layer. In some embodiments, the second blocking insulating layer may be a high-k dielectric layer and the first blocking insulating layer may be of a material with a smaller dielectric constant than the second blocking insulating layer.

Referring to FIG. 27, the memory layer 220 may be formed in the channel holes 105 before the formation of the active patterns 173. For instance, the formation of the memory layer 220 may include sequentially forming the blocking insulating layer BLL, the charge storing layer CL, and the tunnel insulating layer TIL on a sidewall of the channel holes 105. The active patterns 173 and the first gap-filling pattern 181 may be formed to fill the channel holes 105 provided with the memory layer 220.

Referring to FIG. 28, the memory layer may include a first memory layer DA1 and a second memory layer DA2. The first memory layer DA1 may be formed in the channel holes 105, and the second memory layer DA2 may be formed in the recess region 210. According to some embodiments, some of the blocking insulating layer BLL, the charge storing layer CL, and the tunnel insulating layer TIL may constitute the first memory layer DA1, and the others of them may constitute the second memory layer DA2.

Figure 31:
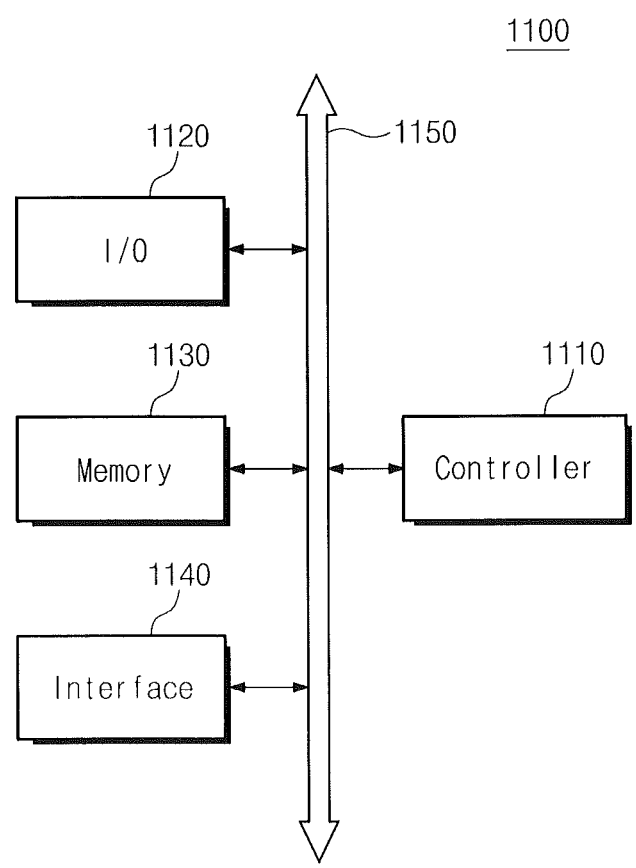

FIG. 31 is a schematic block diagram illustrating an example of a memory system including a 3D semiconductor memory device according to some embodiments of the inventive concept. Referring to FIG. 31, a memory system 1100 can be applied to a personal digital assistant (PDA), a portable computer, a web tablet, a wireless phone, a mobile phone, a digital music player, a memory card and/or any device that can transmit and/or receive data in a wireless communication environment.

The memory system 1100 includes a controller 1110, an input/output device 1120 such as a keypad and a display device, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 may be used to store an instruction executed by the controller 1110. The input/output device 1120 can receive data or a signal from the outside of the system 1100 or transmit data or a signal to the outside of the system 1100. For example, the input/output device 1120 may include a keyboard, a keypad and/or a displayer.

The memory 1130 includes the nonvolatile memory device according to embodiments of the inventive subject matter. The memory 1130 may further include a different kind of memory, a volatile memory device capable of random access and various kinds of memories.

The interface 1140 transmits data to a communication network or receives data from a communication network.

Figure 29:
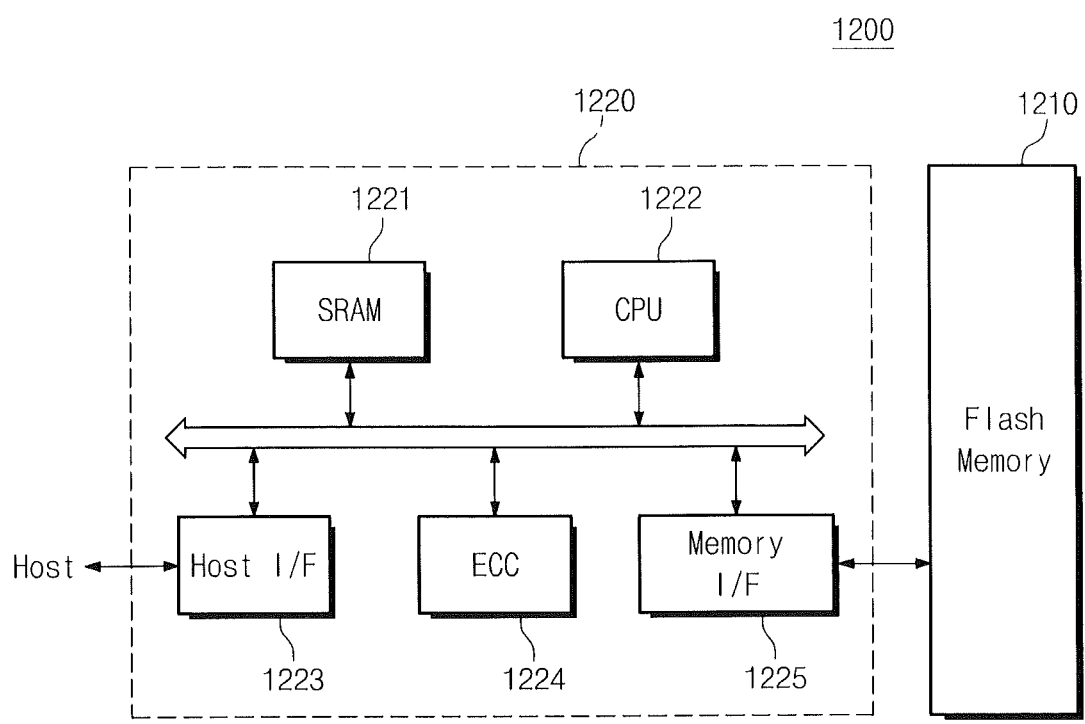

FIG. 29 is a block diagram illustrating an example of a memory card including a three-dimensional semiconductor memory device according to some embodiments of the inventive concept. Referring to FIG. 29, the memory card 1200 for supporting a storage capability of a large capacity is fitted with a memory device 1210 according to some embodiments of the inventive subject matter. The memory card 1200 according to some embodiments of the inventive subject matter includes a memory controller 1220 controlling every data exchange between a host and the memory device 1210.

A static random access memory (SRAM) 1221 is used as an operation memory of a processing unit (CPU) 1222. A host interface 1223 includes data exchange protocols of a host to be connected to the memory card 1200. An error correction block 1224 detects and corrects errors included in data read-out from a multi bit memory device 1210. A memory interface 1225 interfaces with the memory device 1210 of some embodiments of the inventive subject matter. The processing unit (CPU) 1222 performs control operations for exchanging data of the memory controller 1220. Even though not depicted in drawings, it is apparent to one of ordinary skill in the art that the memory card 1200 according to some embodiments of the inventive subject matter can further include a ROM (not shown) storing code data for interfacing with the host.

Figure 30:
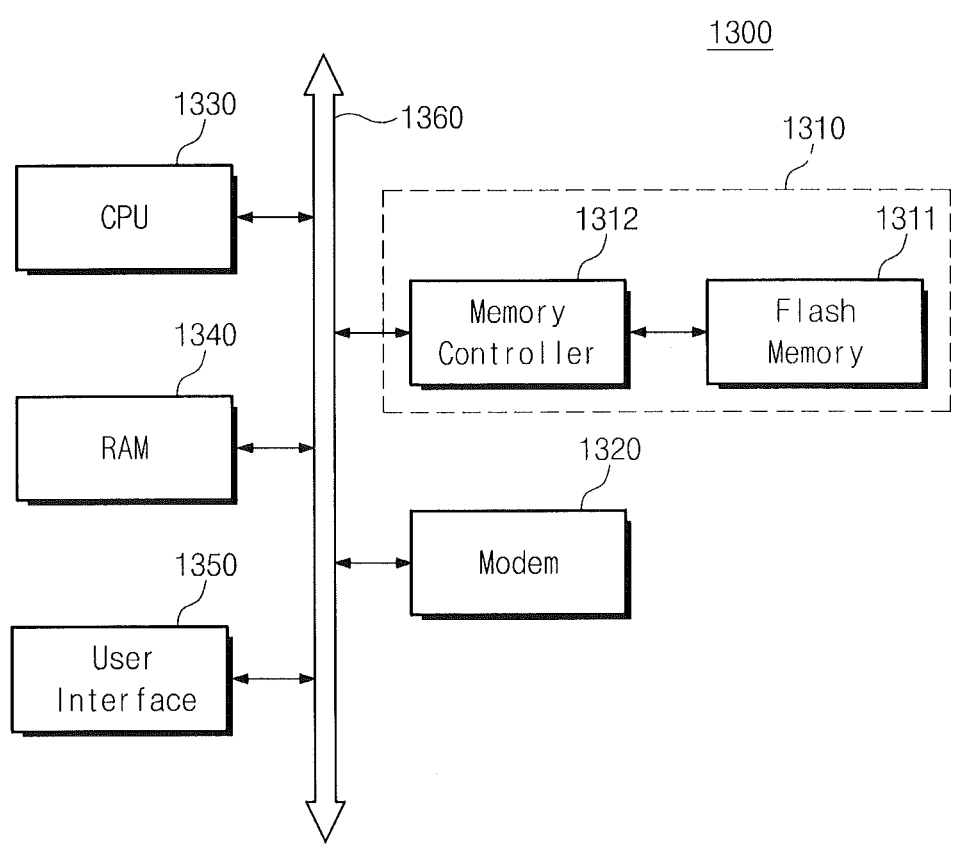

FIG. 30 is a block diagram illustrating an example of an data processing system including a semiconductor memory device according to some embodiments of the inventive subject matter. Referring to FIG. 30, a memory system 1310 of the inventive subject matter is built in a data processing system such as a mobile product or a desktop computer. The data processing system 1300 according to the inventive subject matter includes the memory system 1310 and a modem 1320, a central processing unit 1330, a RAM 1340, and a user interface 1350 that are electrically connected to a system bus 1360. The memory system 1310 may be constructed to be identical to the memory system or the memory system described above. The memory system 1310 stores data processed by the central processing unit 1330 or data inputted from an external device. The memory system 1310 may include a solid state disk (SSD) and in this case, the data processing system 1310 can stably store huge amounts of data in the memory system 1310. As reliability is improved, the memory system 1310 can reduce resources used to correct errors, thereby providing a high speed data exchange function to the data processing system 1300. Even though not depicted in the drawings, it is apparent to one of ordinary skill in the art that the data processing unit 1300 according to some embodiments of the inventive subject matter can further include an application chipset, a camera image processor (CIS) and/or an input/output device.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to some embodiments is mounted may further include at least one semiconductor device (e.g., a controller and/or a logic device) that controls the semiconductor memory device.

According to example embodiments of the inventive concept, the stacked structure may be formed to include a pad region with a reduced occupying area, and consequently, it is possible to increase an integration density of a 3D semiconductor device. Additionally, in some embodiments, pads can be formed by patterning a plurality of horizontal layers using a single photoresist film.

According to the afore-described embodiments of the inventive concept, the diffusion-resistant doped region may be provided in the active pattern. Due to the presence of the diffusion-resistant doped region, impurities injected into the active pattern can be prevented from being diffused. In addition, the inversion inducing pattern may be provided around the active pattern. Due to the presence of the inversion inducing pattern, the inversion region can be easily induced in the channel connecting region.

While example embodiments of the inventive concept have been particularly shown and described, it will be understood by one of ordinary skill in the art that variations in form and detail may be made therein without departing from the spirit and scope of the attached claims.

What is claimed is:

1. A three-dimensional semiconductor device, comprising:
a substrate;
a plurality of conductive patterns stacked on the substrate and including word lines and string selection lines on the word lines; and
an active pattern that is connected to the substrate and that penetrates ones of the plurality of conductive patterns, the active pattern including a doped region that is disposed adjacent at least one of the plurality of conductive patterns and a diffusion-resistant doped region that is doped with carbon and that overlaps at least a portion of the doped region wherein the active pattern comprises channel regions disposed adjacent the conductive patterns and channel connecting regions interposed between the channel regions, and wherein a point with the highest impurity concentration of the doped region is in the channel connecting region.

2. The device according to claim 1, wherein the diffusion-resistant doped region is overlapped by substantially all of the doped region.

3. The device according to claim 1, wherein the diffusion-resistant doped region comprises a portion of the active pattern adjacent at least one string selection line.

4. The device according to claim 1, wherein the point with the highest impurity concentration of the doped region is between a first and second point with the peak carbon concentration.

5. The device according to claim 1, wherein the active pattern comprises channel regions disposed adjacent the conductive patterns and channel connecting regions interposed between the channel regions, and
wherein a point with the highest carbon concentration of the diffusion-resistant doped region is in the channel connecting region.

6. The device according to claim 1,
wherein the active pattern includes a silicon containing material, and
wherein the number of carbon atoms per unit volume is about 0.1% to about 2% with respect to the number of silicon atoms per unit volume in the diffusion-resistant doped region.

7. The device according to claim 1, wherein the doped region comprises a first doped region, further comprising a second doped region provided in an upper portion of the active pattern,
wherein the diffusion-resistant doped region and the first doped region are formed spaced apart from the second doped region.

8. The device of claim 1, further comprising a memory layer interposed between ones of the conductive patterns and the active pattern.

9. A three-dimensional semiconductor device, comprising:
- a plurality of conductive patterns that are stacked on a substrate;
- an inversion inducing pattern that is in an electrically floating state formed on the substrate, the plurality of conductive patterns positioned between the inversion inducing layer and the substrate; and
- a plurality of active patterns that are connected to the substrate and that penetrate the plurality of conductive patterns and the inversion inducing pattern wherein ones of the plurality of active patterns include a doped region that is disposed adjacent at least one of the plurality of conductive patterns, wherein ones of the plurality of active regions include a diffusion-resistant doped region that is doped with carbon and that overlaps at least a portion of the doped region, wherein the doped region comprises a first doped region and further comprising a second doped region disposed on an upper portion of the plurality of active patterns, and wherein the inversion inducing pattern has a top boundary lower than a top boundary of the second doped region.

10. The device according to claim 9, wherein the inversion inducing pattern has a top boundary that is higher than a bottom boundary of the second doped region.

11. The device according to claim 9, further comprising an insulating layer interposed between the inversion inducing pattern and the plurality of active patterns.

12. The device according to claim 9, wherein the inversion inducing pattern extends in a direction that runs along the conductive patterns and that crosses ones of the plurality of active patterns.

13. The device according to claim 9, wherein the inversion inducing pattern comprises a plurality of inversion inducing patterns, and
- wherein ones of the plurality of inversion inducing patterns are arranged to surround corresponding ones of the plurality of active patterns.

14. The device according to claim 9, wherein ones of the plurality of active patterns comprise:
- a first active pattern on the substrate;
- a second active pattern on the first active pattern; and
- a connection pad that connects the first active pattern with the second active pattern, and
- wherein the inversion inducing pattern comprises a first inversion inducing pattern,
- the device further comprising a second inversion inducing pattern that is in an electrically floating state and that is interposed between two of the conductive patterns adjacently disposed on and below the connection pad.

* * * * *